(12) United States Patent
Umeda

(10) Patent No.: US 6,958,714 B2
(45) Date of Patent: Oct. 25, 2005

(54) ENCODING METHOD AND ENCODING APPARATUS, AND COMPUTER PROGRAM AND COMPUTER READABLE STORAGE MEDIUM

(75) Inventor: Yoshinobu Umeda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/793,848

(22) Filed: Mar. 8, 2004

(65) Prior Publication Data

US 2004/0178933 A1 Sep. 16, 2004

(30) Foreign Application Priority Data

Mar. 11, 2003 (JP) .......................... 2003-064778

(51) Int. Cl.⁷ .......................... H03M 7/46; G06K 9/36
(52) U.S. Cl. .................... 341/63; 341/106; 382/197; 382/198
(58) Field of Search ............... 341/63, 106; 382/197, 382/198

(56) References Cited

U.S. PATENT DOCUMENTS

| | | | |
|---|---|---|---|
| 4,516,173 A * | 5/1985 | Abe et al. ............. | 341/63 |
| 6,181,435 B1 | 1/2001 | Onodera ............... | 358/1.14 |
| 6,215,558 B1 | 4/2001 | Kubota ................. | 358/1.15 |
| 6,304,335 B1 | 10/2001 | Furuya et al. ......... | 358/1.15 |
| 6,531,971 B2 * | 3/2003 | Kempf .................. | 341/63 |
| 6,653,954 B2 * | 11/2003 | Rijavec ................. | 341/63 |
| 6,728,412 B1 * | 4/2004 | Vasylyev .............. | 382/242 |
| 2002/0089695 A1 | 7/2002 | Kubota ................. | 358/1.16 |
| 2002/0176101 A1 | 11/2002 | Tsunekawa .......... | 358/1.9 |
| 2003/0043905 A1 | 3/2003 | Nakayama et al. ... | 375/240.4 |
| 2003/0151759 A1 | 8/2003 | Suzuki et al. ......... | 358/1.13 |

* cited by examiner

*Primary Examiner*—Michael Tokar
*Assistant Examiner*—Lam T. Mai
(74) *Attorney, Agent, or Firm*—Fitzpatrick, Cella, Harper & Scinto

(57) ABSTRACT

This invention re-encodes encoded data (e.g., PackBits encoded data), which is expressed by a data format of a runlength code part indicating the runlength of the same data and a data part indicating the data, and a runlength code part indicating the runlength of a different data stream and a data part indicating the different data stream, to the same data format without decoding that encoded data, thereby improving a compression ratio. To this end, upon reception of data encoded by a PackBits encoding process, a data division unit separates that data into information indicating the runlength of data, and a data part, and outputs them as num and data. A data processing unit masks a predetermined bit in accordance with an instruction from a monitor unit, and outputs that result to a data combining unit. The data combining unit and a data output unit reconstruct and output data in the PackBits format in accordance with the masked data part and num data.

18 Claims, 16 Drawing Sheets

FIG. 12

| | 1202 | | 1203 | | 1204 |
|---|---|---|---|---|---|
| 1201 | l_valid=0 | L_locate=0 | D_locate=1 | addr_buf[0]=0 addr_buf[1]=1 | reencode_valid=0 |
| t0 | d_valid=0 | | | | address=XX |
| | v_out=XX | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t7 | l_valid=0 | L_locate=0 | D_locate=1 | addr_buf[0]=0 addr_buf[1]=1 | reencode_valid=0 |
| | d_valid=1 | | | | address=XX |
| | v_out=00h | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t8 | l_valid=1 | L_locate=0 | D_locate=2 | addr_buf[0]=0 addr_buf[1]=1 | reencode_valid=0 |
| | d_valid=0 | 00h | | | address=XX |
| | v_out=F4h | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t12 | l_valid=1 | L_locate=2 | D_locate=3 | addr_buf[0]=0 addr_buf[1]=1 | reencode_valid=0 |
| | d_valid=0 | F4h | 00h | 02h | | address=XX |
| | v_out=02h | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t13 | l_valid=0 | L_locate=0 | D_locate=1 | addr_buf[0]=0 addr_buf[1]=1 | reencode_valid=0 |
| | d_valid=1 | F4h | 00h | FDh | 02h | | | address=XX |
| | v_out=FDh | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t14 | l_valid=1 | L_locate=4 | D_locate=5 | addr_buf[0]=0 addr_buf[1]=1 | reencode_valid=0 |
| | d_valid=0 | F4h | 00h | FDh | 02h | | | address=XX |
| | v_out=04h | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |
| t15 | l_valid=0 | L_locate=4 | D_locate=6 | addr_buf[0]=0 addr_buf[1]=1 | reencode_valid=0 |
| | d_valid=1 | F4h | 00h | FDh | 02h | | 04h | | address=XX |
| | v_out=02h | | | | reencode_data=XX |
| | v_end=0 | | | | reencode_end=0 |
| | | data buf[0] | data buf[1] | data buf[2] | data buf[3] | data buf[4] | data buf[5] | data buf[6] | data buf[7] | data buf[8] | data buf[9] | data buf[10] | data buf[11] | data buf[12] | data buf[13] | data buf[14] | data buf[15] | |

ENCODING METHOD AND ENCODING APPARATUS, AND COMPUTER PROGRAM AND COMPUTER READABLE STORAGE MEDIUM

FIELD OF THE INVENTION

The present invention relates to a technique for processing and re-encoding encoded data.

BACKGROUND OF THE INVENTION

As one of data compression encoding techniques, Pack-Bits encoding is known. PackBits encoding is one of run-length encoding techniques, and can decode information before encoding without any losses, i.e., it is also lossless encoding.

PackBits encoding will be explained below under the assumption that one data as a unit to be encoded consists of 8 bits (data is, e.g., 8-bit multi-valued pixel data). Also, data before encoding will be referred to as raw data, and a stream of raw data before encoding will be referred to as a raw data stream.

PackBits encoding separates a raw data stream into "continuous parts of the same data" and "continuous parts of different data", and appends "length information" of data to each part. Each "continuous part of the same data" is expressed by a pattern "runlength+data", and each "continuous part of different data" is expressed by a pattern "runlength of different data+different data stream". A data stream generated by this process is output as PackBits encoded data.

Assume that a raw data stream (24 data) expressed by:

$$0,0,0,0,1,2,3,4,4,4,4,4,4,4,4,5,5,6,7,8,8,9,10,10 \quad (1)$$

is input. Each individual data is expressed by 8 bits (data ranging from 0 to 255).

In this case, this raw data stream is separated into "continuous parts of the same data" and "continuous parts of different data" like:

0,0,0,0,
1,2,3,
4,4,4,4,4,4,4,4,
5,5,
6,7,
8,8,
9,
10,10

"Length information" is appended to each part, and in each "part wherein the same data continuously appear", a data part is compressed to only one data.

0,0,0,0, Aly* ⇒ (−4),0,
1,2,3, Aly* ⇒ (3),1,2,3,
4,4,4,4,4,4,4,4, Aly* ⇒ (−8),4,
5,5, Aly* ⇒ (−2),5,
6,7, Aly* ⇒ (2),6,7,
8,8, Aly* ⇒ (−2),8
9, Aly* ⇒ (1),9
10,10 Aly* ⇒ (−2),10 (3)

In (3), "length information" is put in parentheses. The positive and negative signs of "length information" are attached to discriminate whether the same data or different data continuously appear. That is, the negative sign indicates "continuous parts of the same data" and the positive sign indicates "continuous parts of different data". This "length information" is embedded in a data stream as "length code data" having the same 8-bit width, and the data stream is output. More specifically, the most significant bit MSB of 8 bits of the length code data is handled as a positive/negative sign bit.

Only one data like the value "9", which is present in isolation between continuous data, is defined as "run of one different data". For this reason, a minimum runlength of same data is 2.

The relationship (table) among the length code data, "runlength of data with the same value", and "runlength of data with different values" are as follows (note: "0x" indicates a hexadecimal number).

| Runlength of data with the different value | Length code data |
|---|---|
| 1 | 0x00 |
| 2 | 0x01 |
| 3 | 0x00 |
| ⋮ | ⋮ |
| 127 | 0x7E |
| 128 | 0x7F |

| Runlength of data with same values | Length code data |
|---|---|
| 2 (−2) | 0xFF |
| 3 (−3) | 0xFE |
| ⋮ | ⋮ |
| 127 (−127) | 0x82 |
| 128 (−128) | 0x81 |

Therefore, when raw data stream (1) above is PackBits-encoded, an encoded data stream expressed by:

FD,00,02,01,02,03,F9,04,FF,5,01,06,07,FF,08,00,09,FF,10 (4)

is generated.

As described above, PackBits encoding can express a runlength of the different data from 1 to 128, and a runlength of same data from 2 to 128. Therefore, if the runlength of the same data is 129 or more, a code of a run of 128 data (length code data+data that run) is generated, and for the 129th and subsequent data, a code having that 129th data as a start point is generated. The same applies to a run of different data.

Note that PackBits encoding does not generate 0x80 as "length code data", as shown in the table above. Therefore, this "0x80" is often defined as end-of-list code data indicating the end of an encoded data stream.

In the following description, "length code data" in PackBits encoded data will be expressed by "length information" and a part indicating an actual data value or values output after the length information will be expressed by "data part".

As described above, PackBits encoding can reduce the data size after encoding as the frequency of occurrence of runs of data with the same values increases (to attain a high compression ratio).

In general, upon compressing data, compression encoding is often made while setting a target size like ½ or less (compression ratio of twice or more) or ¼ or less (compression ratio of four times or more) with respect to a raw data size. In case of PackBits encoding, the compression ratio is improved when three or more data run. However, when different data run, the data size increases in correspondence with "length information" appended.

Therefore, when a target data size cannot be attained by PackBits encoding, it cannot be attained unless a change is made to form runs of the same data.

If an arbitrary bit of raw data is fixed to zero, the number of types of values that can be assumed is halved, and the same values become more likely to run inevitably. Hence, upon compressing such data, a high compression ratio is obtained. For example, taking a multi-valued pixel as an object to be compression-encoded, if its LSB is fixed to zero, both pixel values expressed by 2n and 2n+1 (n=0, 1, 2, ... ) are rounded to "2n". In case of a halftone image, since neighboring pixels have small density and luminance differences, the same values are easily obtained by changing the bit values, as described above. That is, as can be seen from the above description, a high compression ratio can be attained by executing the bit change process. Likewise, when two appropriate bits are fixed to zero, a still higher compression ratio can be attained.

However, in order to execute the aforementioned rounding process for each individual data of a set of original raw data (e.g., of multi-valued image data), processes proportional to the data size are required, and a high processing speed cannot be expected. Also, a memory that stores whole original raw data is required to attain such process.

SUMMARY OF THE INVENTION

It is an object of the present invention to provide a technique for re-encoding encoded data (e.g., PackBits encoded data), which is expressed by a data format of a runlength code part indicating a runlength of the same data and a data part indicating the data, and a runlength code part indicating a runlength of a different data stream and a data part indicating the different data stream, to the same data format at a higher compression ratio without decoding that encoded data.

In order to achieve the above object, for example, an encoding method of the present invention comprises the following steps.

That is, there is provided an encoding method for re-encoding encoded data, which is expressed by a data format of a runlength code part indicating a runlength of the same data and a data part indicating the data, and a runlength code part indicating a runlength of a different data stream and a data part indicating the different data stream, to that data format, comprising:

a step of inputting a stream of encoded data in the data format;

a step of separating a runlength code and a data part from the input stream;

a step of changing a desired bit in the separated data part;

a step of reconstructing the data format on the basis of the changed data part and the runlength code part; and a step of outputting the reconstructed data as a re-encoded data stream.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 12 is a transition chart of internal states upon operation of the data output unit 104 in the embodiment of the present invention;

DETAILED DESCRIPTION OF THE PREFERRED EMBODIMENTS

Preferred embodiments of the present invention will be described hereinafter with reference to the accompanying drawings.

<Overview>
A description of this embodiment will be given taking a digital copying machine as an example.

Figure 14:
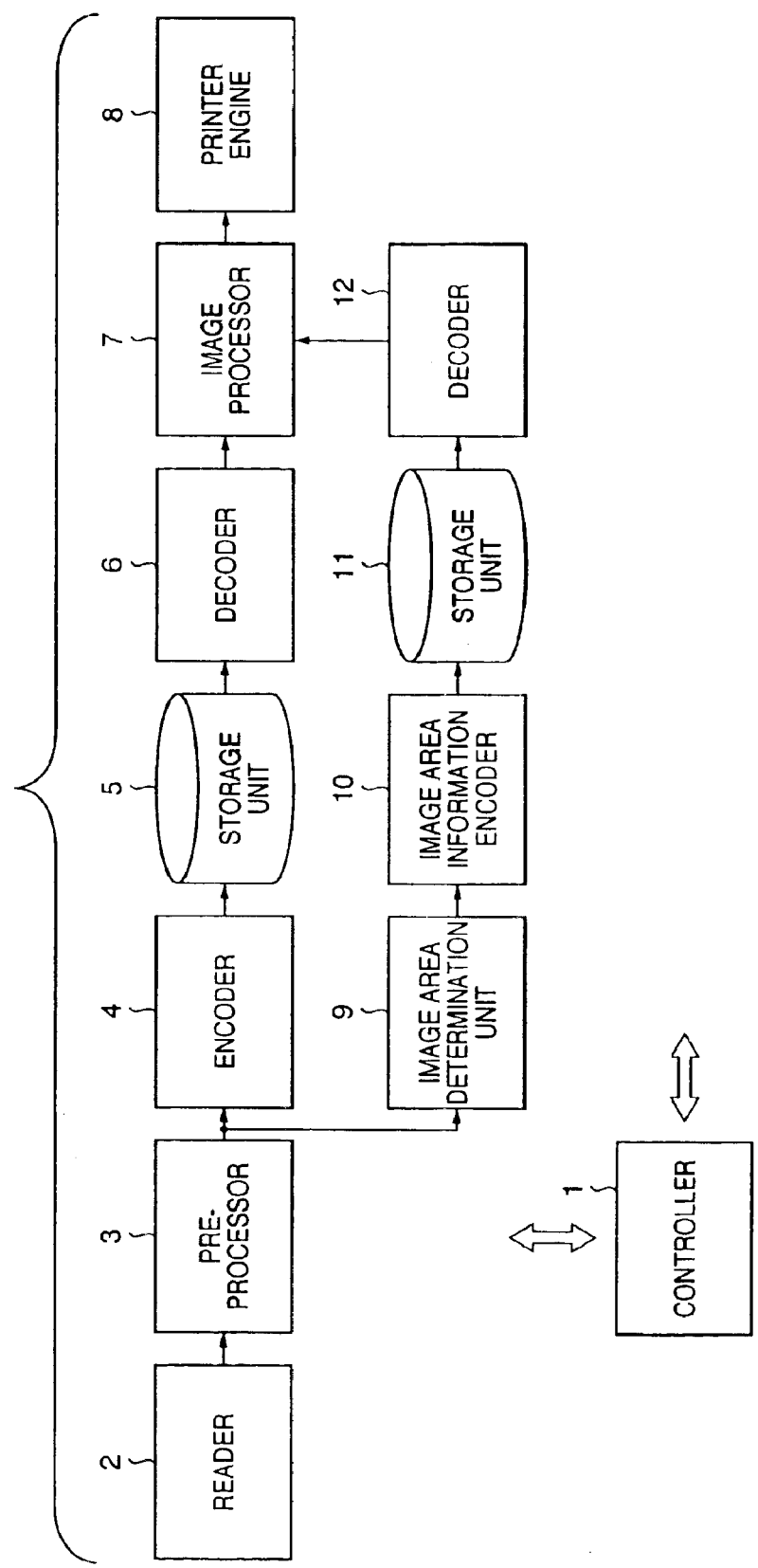
FIG. 14 is a block diagram of a digital copying machine to which the embodiment of the present invention is applied.

FIG. 14 is a block diagram of a digital copying machine in this embodiment. Referring to FIG. 14, reference numeral 1 denotes a controller which controls the overall apparatus, and comprises a CPU, a ROM that stores a control processing program of the CPU, and a RAM used as a work area. Reference numeral 2 denotes a reader which reads a document, and comprises an image sensing unit that scans a document image as a color image, and an ADF (Auto Document Feeder). Reference numeral 3 denotes a pre-processor which executes various correction process (e.g., including shading correction and the like). Reference numeral 4 denotes an encoder which compression-encodes image data obtained by scanning in accordance with, e.g., a JPEG encoding scheme. Reference numeral 5 denotes a storage unit which temporarily stores compression-encoded data. Therefore, when the reader 2 sequentially scans document images, their compressed-encoded data are stored in the storage unit 5. Reference numeral 6 denotes a decoder which decodes the compression-encoded data stored in the storage unit 5. Reference numeral 7 denotes an image processor which generates data of print color components for respective pixels decoded by the decoder 6 and executes a process specialized to an image area on the basis of information for respective pixels from a decoder 12 (to be described later). For example, the result of a character/line image area is output to a printer engine 8, and is printed. The printer engine 8 comprises a color laser beam printer engine. However, the printer engine 8 may be of a type that ejects ink liquids, and the print system is not particularly limited.

On the other hand, data of respective color components output from the pre-processor 3 are supplied to an image area determination unit 9, which determines the type of image area for each pixel, and outputs this determination result as 1-byte attribute information per pixel.

The contents determined by the image area determination unit 9 include whether or not the pixel of interest is a pixel in a character/line image included in a dot pattern, whether the pixel of interest has a chromatic or achromatic color, whether or not the pixel of interest forms a character (character/line image area or halftone area), and width information of a line segment if the pixel of interest forms a character/line image.

Whether or not the pixel of interest forms a character/line image is determined by checking whether or not a luminance change between the pixel of interest and its neighboring pixel is steep (exceeds a threshold value). If a predetermined number of pixels which are determined to have a steep change successively appear, it is determined that they form a character/line image; otherwise, it is determined that they form a dot. Therefore, whether or not the pixel of interest forms a character in a dot pattern is determined by checking if the pixel of interest forms a character and if a plurality of pixels which are determined to form a dot are present within a predetermined distance range from the character. When it is determined that the pixel of interest forms neither a character/line image nor a dot, a halftone area can be determined.

Upon checking whether the pixel of interest has a chromatic or achromatic color, if a luminance value difference of respective luminance color components R, G, and B of the pixel of interest is equal to or smaller than a threshold value, an achromatic color is determined. In order to improve the determination precision, if at least one chromatic color pixel is present in the neighborhood of the pixel of interest, the pixel of interest is determined to have a chromatic color.

The width information of a character can be obtained by counting the number of pixels which are determined to form a character/line image in a direction perpendicular to a direction parallel to the edges of pixels which are determined to form a character.

As described above, the image area determination unit 9 outputs its determination result as 8-bit data per pixel. The contents of 8 bits are:

| Bit | Meaning | |
|---|---|---|
| 7 | Reserved (0) | |
| 6 | Reserved (0) | |
| 5 | Character width | Bits 4 and 5 express width (0 |
| 4 | Character width | to 3) of character/line image |
| 3 | Reserved (0) | |
| 2 | Character | Character/line image = 1, non-character/line image (halftone) = 0 |
| 1 | Character in dot pattern | Character/line image in dot pattern = 1, other = 0 |
| 0 | Achromatic color | achromatic color = 1, chromatic color 0 |

The image area determination unit 9 outputs 1-byte image area information per pixel. An image area information encoder 10 compresses this information by PackBits encoding. Since a characteristic feature of this embodiment lies in this image information encoder 10, details of that encoder 10 will be explained later. Reference numeral 11 denotes a storage unit which temporarily stores image area information PackBits-encoded by the image information encoder 10. Reference numeral 12 denotes a decoder which decodes the compression-encoded image area information stored in the storage unit 11, and supplies decoded information to the image processor 7. Therefore, the decoders 6 and 11 synchronously output their decoding results to the image processor 7.

Figure 15:
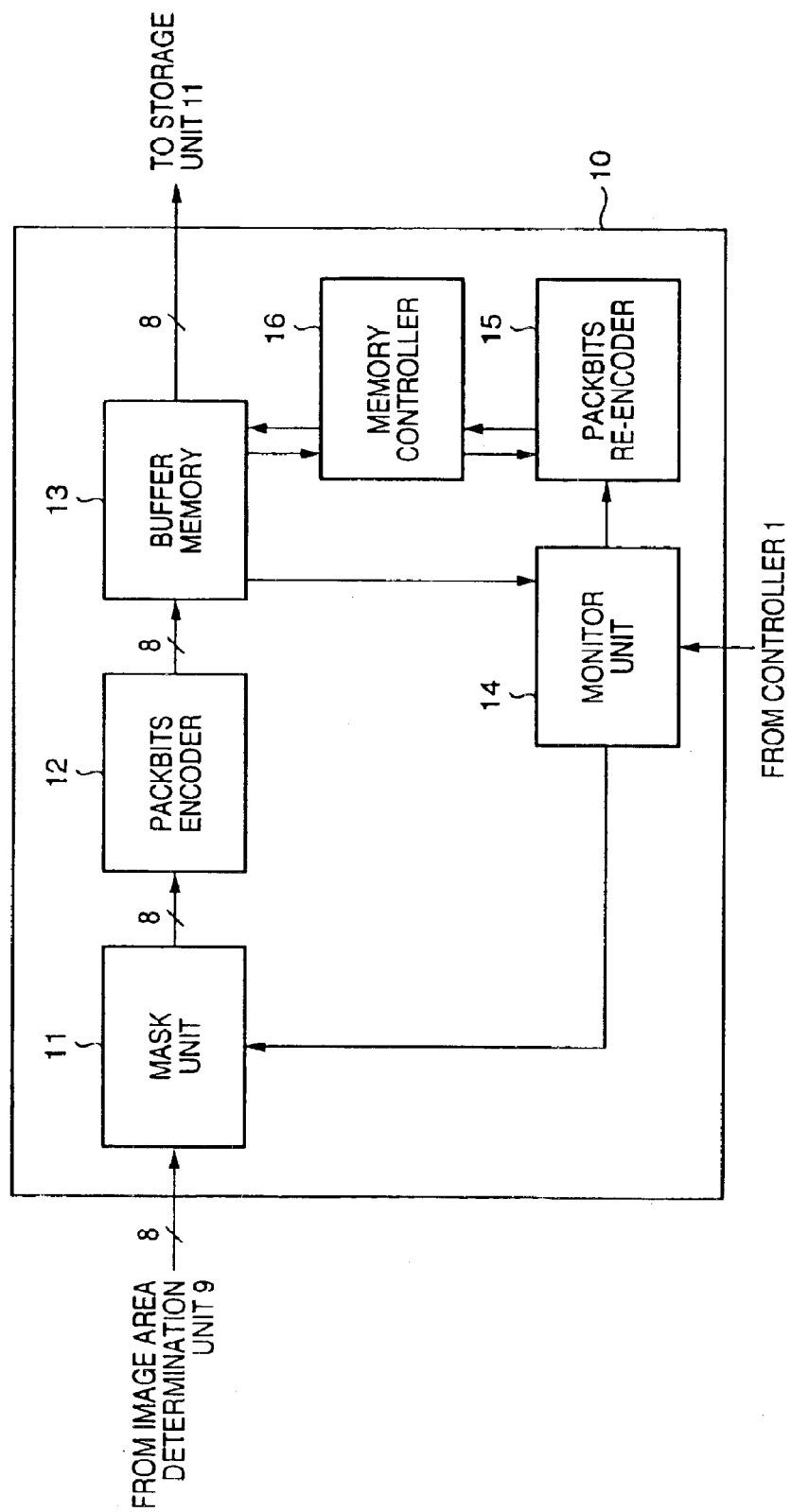
FIG. 15 is a block diagram of an image area information encoder in FIG. 14.

In the above arrangement, the image area information encoder 10 of this embodiment has an arrangement shown in, e.g., FIG. 15.

Referring to FIG. 15, reference numeral 11 denotes a mask unit which conditionally masks respective bits of one byte (image area information of each pixel) from the image area determination unit 9 in accordance with an instruction from a monitor unit (to be described later), and allows all bits to pass through in an initial state of one page.

Reference numeral 12 denotes a PackBits encoder which sequentially receives image area data input via the mask unit 11, and applies known PackBits encoding. Reference numeral 13 denotes a buffer memory for temporarily storing encoded data upon outputting the data to the storage unit 12. Reference numeral 14 denotes a monitor unit (under the control of the controller 1) which monitors the size of data stored in the buffer memory 13. When a predetermined code size (threshold value) is reached before completion of storage of encoded data of attribute information for one page of document image, the monitor unit 14 determines a bit or bits to be masked by the mask unit 11, and generates a control signal to be output to a PackBits re-encoder 15 to be described below. The PackBits re-encoder 15 re-encodes compression-encoded image area information stored in the buffer memory 13, and stores the re-encoded information in the buffer memory 13 again. The re-encoding conditions (compression parameters) in this case vary depending on a control signal output from the monitor unit 14 (details will be described later). The monitor unit 14 also monitors the data size obtained by this re-encoding process. Reference numeral 16 denotes a memory controller which is inserted between the PackBits re-encoder 15 and buffer memory 13, and control data read and write accesses by the PackBits re-encoder 15.

In the above arrangement, the monitor unit 14 of this embodiment sets the mask unit 11 to pass all data of 8 bits through it in an initial stage upon scanning one page of document image. The monitor unit 14 monitors the encoded data size of image area information stored in the buffer memory 13. When the monitor unit 14 determines that a data size which is set in advance has been reached (overflow state) before data for one page are stored, it controls the mask unit 11 to mask a predetermined bit or bits to set limits to image area information to be input subsequently. Also, the monitor unit 14 controls the PackBits re-encoder 15 to re-encode the encoded data (image area information) already stored in the buffer memory 13. Upon re-encoding, the monitor unit 14 sets to mask a predetermined bit or bits as in the mask unit 11.

As a result, after the overflow state is determined, the buffer memory 13 stores data which undergo PackBits encoding based on a masked result. Also, encoded data of image area information encoded before the determination timing of the overflow state are re-encoded by the PackBits re-encoder 15. When the overflow state is reached, the monitor unit 14 temporarily resets the monitored data size, and continuously monitors whether or not the total value of the data size output from the PackBits encoder 11 and the re-encoded data size of the PackBits re-encoder 15 overflows. When the compression-encoded data size of attribute information for one page overflows again, the monitor unit 14 increases the number of bits to be masked, and repeats the aforementioned processes.

In this embodiment, an overflow (OF) count, and mask conditions and bits of image area information are:

| OF count | Condition & mask bit |
| --- | --- |
| 0 | No mask |
| 1 | Set achromatic color (bit 0) to zero if character flag (bit 2) = 0 |
| 2 | Set character width (bits 4 and 5) to zero if character flag = 0 |
| 3 | Set dot character flag (bit 1) to zero character flag = 0 |
| 4 | Set all zeros other than character flag |
| 5 | Set all zeros |

To explain the above contents simply, each attribute of a pixel is changed to an attribute that includes it. For example, the reason why an achromatic color is changed to a chromatic color upon the first overflow is that an achromatic color space is included in a chromatic color space.

In the mask unit 11, when the overflow count is, e.g., 2, the first and second mask conditions are ORed and the number of bits to be masked is 2. On the other hand, the PackBits re-encoder need only execute the aforementioned process. This is because data to be re-encoded has already been masked in the previous encoding or re-encoding process.

In the above process, the PackBits encoder 12 need only simply continue a process irrespective of the overflow count. On the other hand, the PackBits re-encoder 15 is required to execute a very high-speed process.

Focusing attention on the fact that data to be re-encoded by the PackBits re-encoder 15 in this embodiment is PackBits encoded data, that encoded is re-encoded without being decoded. Practical solutions will be described below.

<PackBits Re-Encoder 15>

Figure 1:
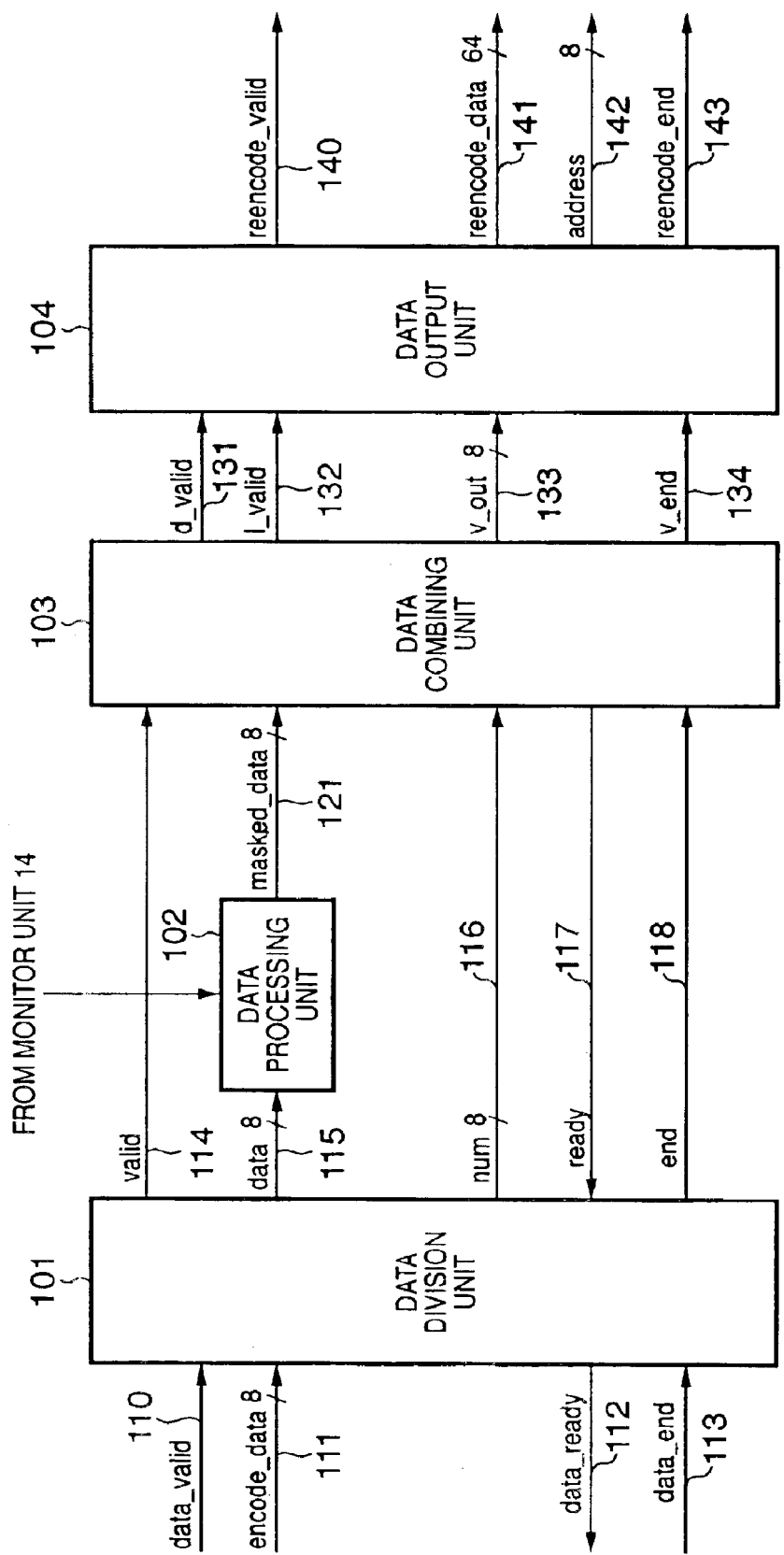
FIG. 1 is a block diagram of a PackBits re-encoder according to an embodiment of the present invention.

FIG. 1 is a block diagram of the PackBits re-encoder in this embodiment. The arrangement and processing contents of the PackBits re-encoder will be described below using the block diagram of FIG. 1.

Referring to FIG. 1, reference numeral 101 denotes a data division (separation) unit, which determines length information and a data part of PackBits encoded data input from encode_data (111 in FIG. 1) via the memory controller 16, and interprets the input length data to output how many data values run in the data part (to be referred to as a runlength hereinafter) input after the length information simultaneously with the data values. That is, the unit 101 separates length information and a data part.

The data division unit 101 of this embodiment acquires PackBits encoded data using data_valid (110) as a valid signal indicating that PackBits encoded data is input from encode_data, an end signal data_end (113) indicating the end of input of encoded data, and a ready signal data_ready (112) which notifies the memory controller 16 that the data division unit is ready to receive encoded data, in addition to encode_data that actually receives PackBits encoded data. In other words, when this data_ready signal is enabled, the memory controller 16 reads out the next data from the buffer memory 13.

The data division unit 101 outputs a data value or values using data (115) and a runlength using num (116). In this embodiment, data exchange is made using a valid signal valid (114) indicating that the values output from data and num are valid, a ready signal ready (117) indicating that the receiving side is ready to receive data, and an end signal end (118) indicating the end of output of data, in addition to the aforementioned buses data and num. The operations of these input/output signals will be described later.

Reference numeral 102 denotes a data processing unit which executes a process for masking (setting a bit value to zero) of a data value or values which is or are input as data (115) from the data division unit 101 in accordance with a control signal from the monitor unit 14 and the aforementioned conditions, and outputs the masked data value or values as masked_data (121).

Reference numeral 103 denotes a data combining unit, which generates new encoded data by applying a PackBits encoding process to a part whose data size can be reduced with reference to the data value or values output as masked_data from the data processing unit 102 and the runlength output from the data division unit 101 via num.

In this embodiment, the data value or values and runlength are acquired using valid, ready signal ready, and end signal end described in the data division unit 101 in addition to num and masked_data.

Encoded data generated by the data combining unit is output using v_out (133). However, as the encoded data output from the data combining unit 103, the data value or values of the data part is or are output first and the length information is then output from v_out unlike normal PackBits encoded data.

For this reason, the data combining unit of this embodiment outputs encoded data using l_valid as a length information valid signal, d_valid as a data part valid signal, and an end signal v_end (134) indicating the end of output of data so as to identify whether data output from v_out is length information or a data part.

Reference numeral 104 denotes a data output unit which replaces the order of the length information and data part in the encoded data acquired from the data combining unit 103 to obtain that of normal PackBits encoded data. The data combining unit 103 and data output unit 104 reconstruct PackBits encoded data.

In this embodiment, PackBits encoded data for eight data are combined to generate 64-bit data, which is output from reencode_data (141). Also, a memory address that stores data output from reencode_data is output from address (142). Upon outputting the data and address from reencode_data and address, "1" is output from reencode_valid as a valid signal to indicate that the data and address are valid.

Upon completion of output of the address and data from the data output unit, 1 is output from reencode_end (143) to notify the next unit of the end of output of data.

Figure 2:
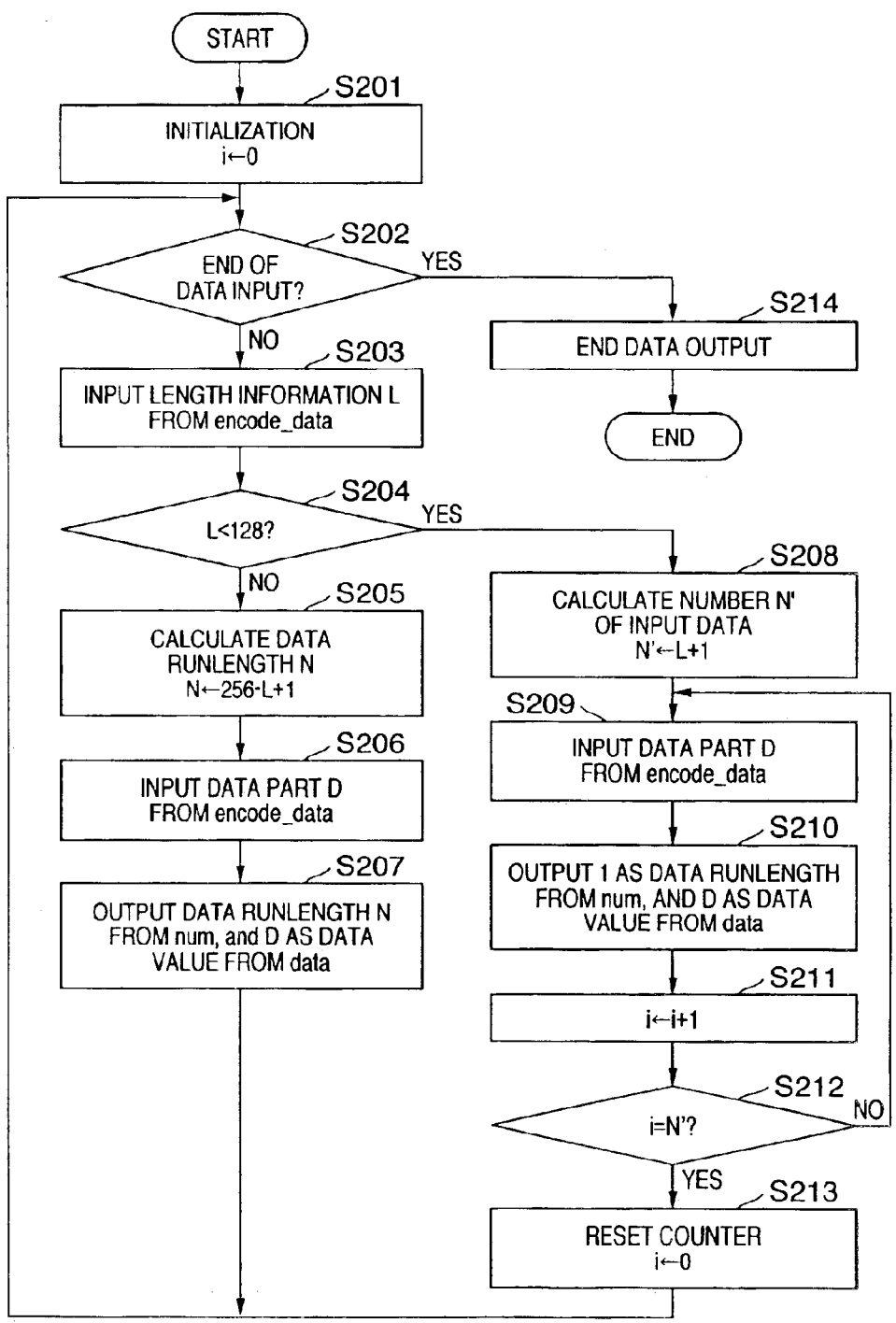
FIG. 2 is a flow chart showing the operation processing contents of a data division unit 101 in the embodiment of the present invention.

The flow chart shown in FIG. 2 shows the operation of the data division unit 101 as a sequence.

Upon starting the operation, the data division unit 101 resets an internal counter (indicated by i in FIG. 2). More specifically, counter i is set to zero (step S201), and it is then checked if input of PackBits encoded data ends (step S202).

The end of input of data may be determined by the aforementioned method, i.e., by "inputting 128 (80h in hex; a value in parentheses that follow a numerical value will indicate hexadecimal notation of that numerical value) as length information". However, in this embodiment, by inputting "TRUE=1" from data_end, the end of input of data is indicated.

If it is determined in step S202 that data input does not end (data_end=0), the data division unit waits for data input from encode_data. Note that the length information of PackBits encoded data is input first as in (3) and (4) described in the prior art. Hence, the data division unit waits for input of length data in practice.

If length information (indicated by L in FIG. 2) as the first encoded data is input from encode_data (step S203), the data division unit determines with reference to the value of the input information L whether the length information indicates "a runlength of the same data" or "a runlength of different data". More specifically, the input length information L is considered as signless data, and is compared with a threshold value "128 (80h)" (step S204). If L≧128, it is determined that L indicates "a runlength of the same data"; otherwise, it is determined that L indicates "a runlength of different data".

If the input length information L is equal to or larger than 128 (80h), the data division unit calculates the runlength of the same data from the length information L and substitutes it in variable N. In this embodiment, since the runlength of the same data is expressed as a negative value using a two's complement, the runlength is calculated from the length information L (step S205). More specifically, the runlength is calculated by:

$$N=256-L+1$$

and the calculated value is substituted in N.

After the runlength of the same data is calculated, the data division unit waits for PackBits encoded data input from encode_data. In the PackBits encoded data, when the length information is equal to or larger than 128, the value of data that run is input as the next data. Hence, the data division unit waits for input of a data part (data value).

If a data part (indicated by D in FIG. 2) is input from encode_data (step S206), the data division unit outputs N as the data runlength from the num output (116) and D as the data value from the data output (115) (step S207).

In this way, the data division unit sends information "there are N data values D" to the next unit, and the flow returns to step S202 to determine the end of data input.

If the input length information L is less than 128 (80h), the data division unit calculates a runlength from the length information L and substitutes it in variable N' (step S208). In this embodiment, since the runlength of different data is a value obtained by adding 1 to the length information, the runlength of different data is calculated by:

$$N'=L+1$$

After the runlength of different data is calculated, the data division unit waits for PackBits encoded data from encode_data again. In the PackBits encoded data, when the length information is less than 128, data values as many as N' calculated previously are input after the length information. Hence, the data division unit waits for input of a data part (data values).

After the data part D is input from encode_data (step S209), the data division unit outputs 1 from the num output (116) and the data value D from the data output (115) (step S210). In this manner, the data division unit sends information "the number of data values D output from data is one" to the next unit.

After the data value D is output from data, the data division unit increments internal counter i by 1 (step S211), and compares the counter value with N' (step S212). If i<N', since a data value is subsequently input, the flow returns to step S209, and the data division unit waits for the next data part input from encode_data.

If the counter value i is equal to the value N' as a result of comparison in step S212, since N' data values have been input, the data division unit resets counter i to zero (step S213), and the flow returns to step S202 to determine the end of data input.

By repeating the operations in steps S202 to S213, PackBits encoded data are input. Finally, if data_end=1 is input and the end of input of PackBits encoded data is detected in step S202, the data division unit 101 outputs 1 from the end output to indicate the end of data output, thus ending its operation.

Figure 10:
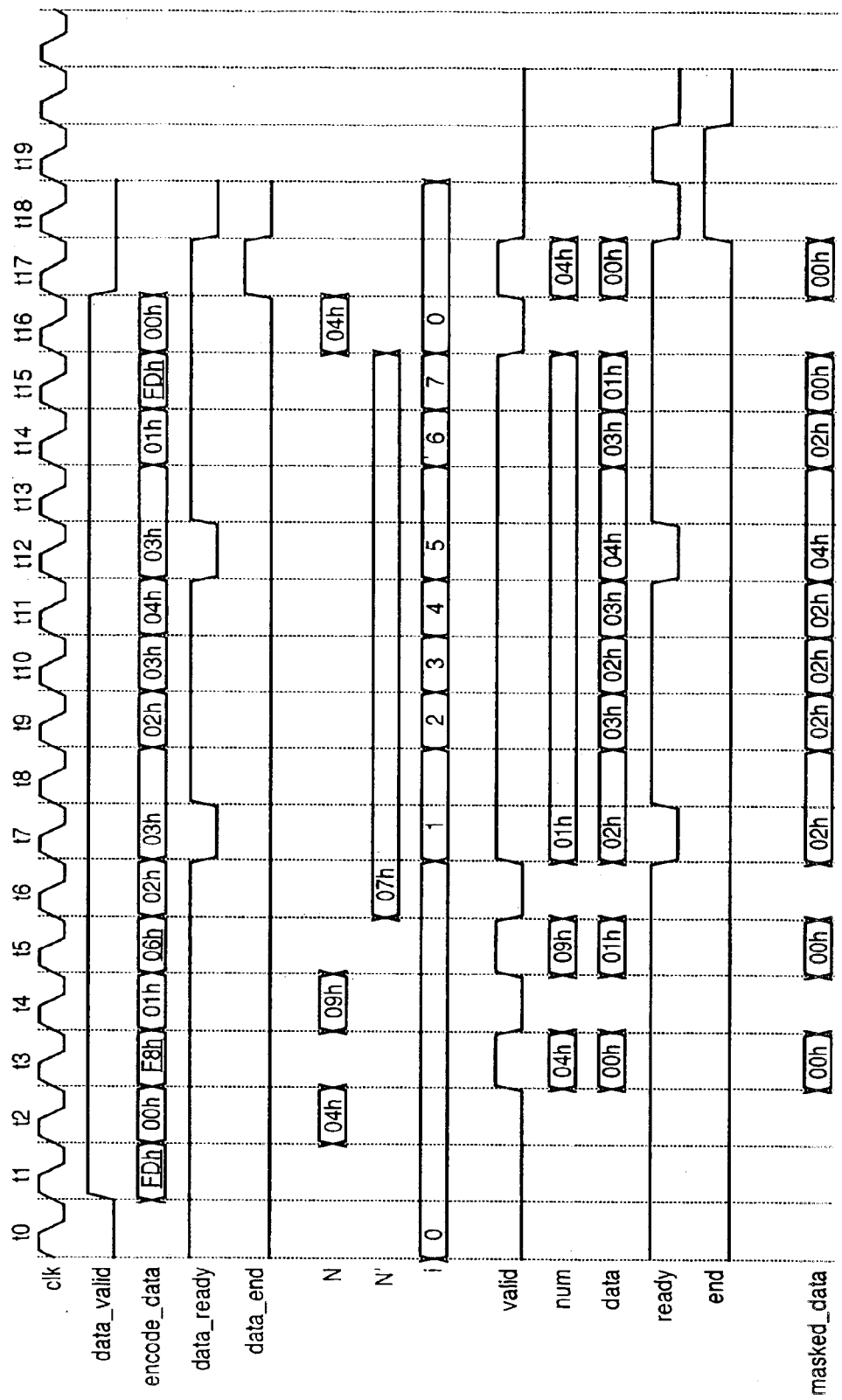
FIG. 10 is an input/output timing chart of the data division unit 101 and a data processing unit 102 in the embodiment of the present invention.

FIG. 10 shows an example of an input/output timing chart of the data division unit 101.

Referring to FIG. 10, clk represents clocks, and respective signals are input/output in synchronism with clk. Signals data_valid, encode_data, data_ready, and data_end are those used to input PackBits encoded data to the data division unit. N, N', and i indicate variables and a counter value used in the data division unit, and signals valid, num, data, ready, and end are those used to output the data part and runlength to the data processing unit 102 and data combining unit 103.

In FIG. 10, each length information of PackBits encoded data input from encode_data is indicated by a double underline.

In FIG. 10, when the operation of the data division unit 101 starts, internal counter i is reset at timing t0 in FIG. 10 (step S201). After that, since data_valid=1 is set from t1, PackBits encoded data begins to be input from encode_data to the data division unit.

Since PackBits encoded data input first to the data division unit is length information, the data division unit acquires an value 253 (=FDh) input at t1 as length information L (step S203). After that, the data division unit compares the acquired length information L with 128 (80h) (step S204). In this case, since a condition:

$$L<128$$

is not met, the data division unit calculates a data runlength=4 (04h) by the calculation shown in step S205, and stores it in N.

The data division unit acquires a value 0 (00h) input from encode_data as a data value D at timing t2 (step S206), and outputs the data runlength N from num and the data value D from data at timing t3 (step S207). The data division unit then refers to data_end in step S202 to check if data input ends.

Since data_end=1 is not input at timing t3, the flow advances to step S203, and the data division unit acquires a value 248 (F8h) input from encode_data as length information L at t3 (step S203). The data division unit then compares the length information L with 128 (80h). The flow advances to step S205, and the data division unit calculates a data runlength=9 (09h) and stores it in N. The data division unit acquires 1 (01h) as a data value D from encode_data at timing t4 (step S206), and outputs the data runlength N from num and the data value D from data at timing t4.

The data division unit checks the end of data input in step S202 again. Since data_end=0 at timing t5, the flow advances to step S203, and the data division unit acquires 6 (06h) input from encode_data at timing t5 as length information L.

In step S204, the data division unit compares the length information L with 128 (80h). In this case, since a condition:

$$L < 128$$

is met, the data division unit calculates a runlength=8 (07h) of data values input after the length information on the basis of the length information L using the equation shown in step S208, and stores it in N' (step S208). After that, the data division unit waits for a data part D input from encode_data.

If "2 (02h)" is input as a data value D from encode_data at timing t6 (step S209), the data division unit outputs 1 (01h) as the data runlength from num and "2 (02h)" as the data value D from data at t7 (step S210). The data division unit increments internal counter i by 1 (step S211), and compares the counter value with N' calculated in step S208 (step S212).

Since the value of internal counter i is 1 at timing t7, and it is not equal to 7 as the runlength of input data stored in N', the flow returns to step S209 to wait for a data part D from encode_data again.

Since data_valid=1 at timing t7, data input from encode_data is valid. However, since the data combining unit 103 (to be described later) is not ready to input data, it outputs a ready signal=0. For this reason, the data division unit outputs 0 from data_ready to suspend data acquisition. At this time, data input from encode_data is held until the next clk.

At t8, the data combining unit 103 is ready to input data and 1 is input from ready. Hence, the data division unit outputs 1 from data_ready, and acquires 3 (03h) as a data value D from encode_data.

After that, the same operations in step S209 to S212 are repeated N' times, and the data division unit outputs 2 (02h) at timing t9 as a value input from encode_data.

Next, the data division unit acquires 3 (03h) at t10, 4 (04h) at t11, 3 (03h) at t13, and 1 (01h) at t14, and outputs, as data, 2 (02h) at timing t10, 3 (03h) at t11, 4 (04h) at t12, 3 (03h) at t14, and 1 (01h) at t15.

Since the value of internal counter i becomes 7 at timing t15, i.e., it is equal to the runlength N' of input data, the data division unit resets internal counter i to zero (step S213) after comparison in step S212. The flow then returns to step S202 to check with reference to data_end if data input ends.

Since data_end=1 is not input at timing t15, the flow advances to step S203 and the data division unit acquires a value 253 (FDh) input from encode_data at timing t15 as length information L (step S203). After the data division unit compares the input value with 128 (80h) in step S204, the flow advances to step S205, and the data division unit calculates a data runlength=4 (04h) and stores it in N. The data division unit acquires 0 (00h) as a data value D from encode_data at timing t16 (step S206), and outputs the data runlength N from num and the data value D from data at timing t17. The flow then returns to step S202.

Since 1 is input from encode_data at timing t17, the data division unit determines in step S202 that data input ends, and outputs 1 from the end output at timing t18, thus notifying the subsequent units of the end of data output (step S214), thus ending this operation.

In FIG. 10, masked_data is the output from the data processing unit 102. This embodiment shows an example of the first overflow with respect to a value output from data of the data division unit 101 in the data processing unit 102. That is, if bit 2 indicating a character is zero, bit 0 is set to zero. However, in case of the next overflow (second overflow), different conditions are applied, as can be seen from the above description.

Since the data processing unit 102 of this embodiment outputs masked_data without any clk delay after a value is input from data to the data processing unit, as shown in FIG. 10, data output from masked_data and information indicating the runlength of data output from num of the data division unit are supplied to the data combining unit at the same timing.

The operation process of the data combining unit 103 in this embodiment will be described below with reference to the flow charts in FIGS. 3 to 8.

When the process starts, the data combining unit 103 waits for the first data runlength and the data value processed by the data processing unit 102, which are input from num and masked_data.

After the data runlength and data value are input (step S301), the data combining unit stores, as initial values, the data runlength input from num in internal variable cnt and the data value input from masked_data in internal variable data_buf (step S302).

The data combining unit refers to the value stored in cnt (step S303). If that value is other than 1, the data combining unit determines that the data value input from masked_data is a data value of a part "the same data values run", and sets 1 in internal variable continue (step S304) so as to hold that state in it.

If the value stored in cnt is 1, the data combining unit determines that the data value input from masked_data is a data value of a part "the same data do not run", and sets 0 in internal variable continue (step S305) so as to hold this state in it.

With these processes, preparation for inputting the next data is complete.

The data combining unit checks the end of data input (step S306). In this embodiment, when the data division unit sets end (118) to "1=high", the data combining unit determines that data input ends, and the flow branches to a process shown in FIG. 8. If 1 is not input from end (118), the data combining unit waits for the next data runlength and data value from num (116) and masked_data (121).

After the data runlength and data value are input from num and masked_data (step S307), the data combining unit controls to branch processes depending on the value of internal variable continue (step S308). If the value of continue is zero indicating a part "the same data do not run", the data combining unit compares the data value input from masked_data with the value of internal variable data_buf (step S309). If the data value input from masked_data is different from the value of data_buf, the flow branches to a process in FIG. 4. On the other hand, if the data value input from masked_data is equal to the value of data_buf, the flow branches to a process in FIG. 5 to execute a process for ending the "part where the same data do not run", and a process for starting a new "part where the same data run".

On the other hand, if it is determined in step S308 that the value of internal variable continue is 1 indicating a part "the same data run", the data combining unit similarly compares the data value input from masked_data with the value of data_buf (step S310). If the data value input from masked_data is different from the value of data_buf, the flow branches to a process in FIG. 6. On the other hand, if the data value input from masked_data is equal to the value of data_buf, the flow branches to a process in FIG. 5 to execute a process for continuing the "part where the same data run".

Figure 3:
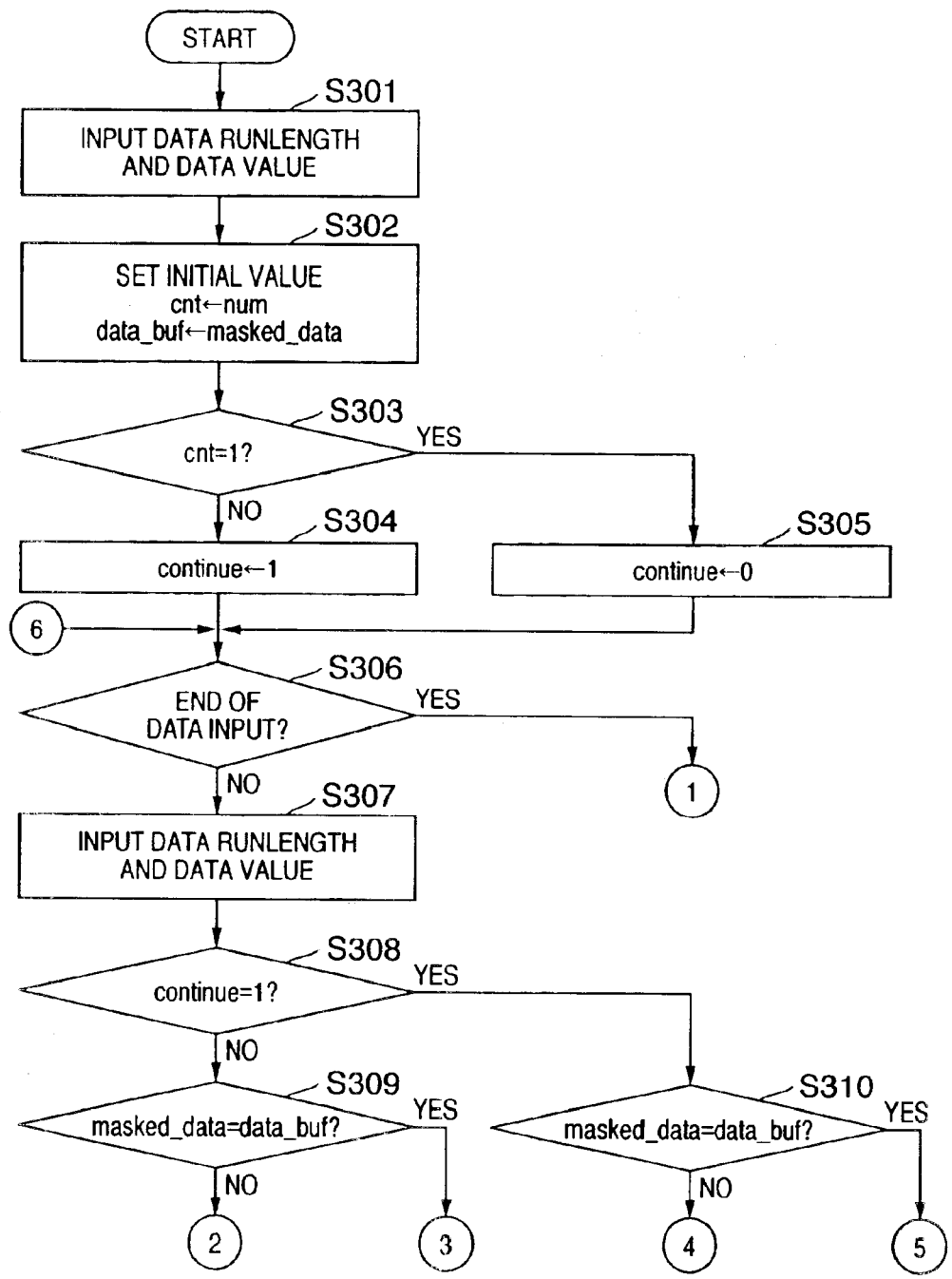
FIG. 3 is a flow chart showing the operation processing contents of a data combining unit 103 in the embodiment of the present invention.
Figure 4:
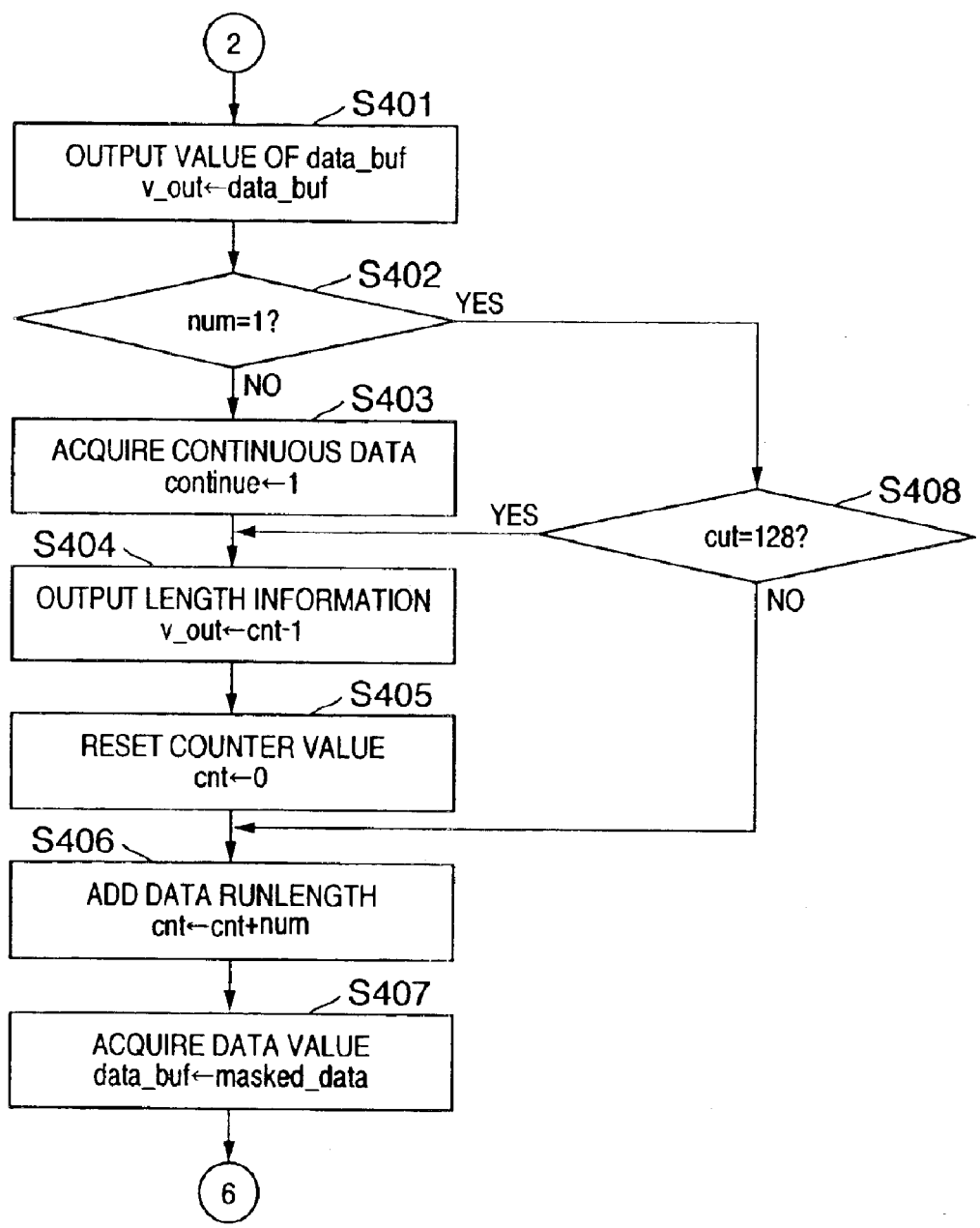
FIG. 4 is a flow chart showing the operation processing contents of the data combining unit 103 in the embodiment of the present invention.

FIG. 4 is a flow chart showing a process executed when internal variable continue=0 and the data value input from masked_data is different from the value of internal variable data_buf (NO in step S309 in FIG. 3).

In this case, the value stored in data_buf is output from v_out since it is required to generate new PackBits encoded data (step S401). Then, the data combining unit refers to the data runlength input from num (step S402).

If the data runlength is other than 1, since it indicates that one or more values input from masked_data run, the part "the same data do not run" ends here. Hence, the data combining unit sets the value of internal variable continue to be 1 indicating a part "the same data run" (step S403), decrements internal counter cnt that stores the number of data of the part "different data run" input so far to obtain the length information indicating the "runlength of different data", and outputs that length data from v_out (step S404).

After that, the data combining unit resets internal variable cnt to zero (step S405). The data combining unit adds the data runlength input from num to cnt (step S406), and stores a data value input from masked_data in internal variable data_buf (step S407) to prepare for reception of the next data. The flow then returns to step S306 in FIG. 3.

On the other hand, if it is determined in step S402 that the data runlength input from num is 1, it indicates that the part "the same data do not run" follows. In this case, the data combining unit refers to the value of internal variable cnt to check if cnt=128 (80h) (step S408). In this embodiment, since PackBits encoded data is expressed by 8 bits, the maximum runlength of the part "the same data run" and part "the same data do not run" that can be expressed is 128. For this reason, if the value of internal variable cnt is 128, information indicating that 128 data run as the part "the same data do not run" must be output. Hence, the data combining unit calculates length information in step S404 (it generates 127 (7Fh) as length information in this case since "128 different data run"), and outputs it from v_out.

After that, the data combining unit resets internal variable cnt to zero (step S405). The data combining unit adds the data runlength (1 in this case) input from num to cnt (step S406), and stores a data value input from masked_data in internal variable data_buf (step S407) to prepare for reception of the next data. The flow then returns to step S306 in FIG. 3.

If it is determined in step S408 that the value of internal variable cnt is not 128 (less than 128), the data combining unit adds the data runlength (1 in this case) input from num to cnt (step S406), and stores a data value input from masked_data in internal variable data_buf (step S407) to prepare for reception of the next data. The flow then returns to step S306 in FIG. 3.

Figure 5:
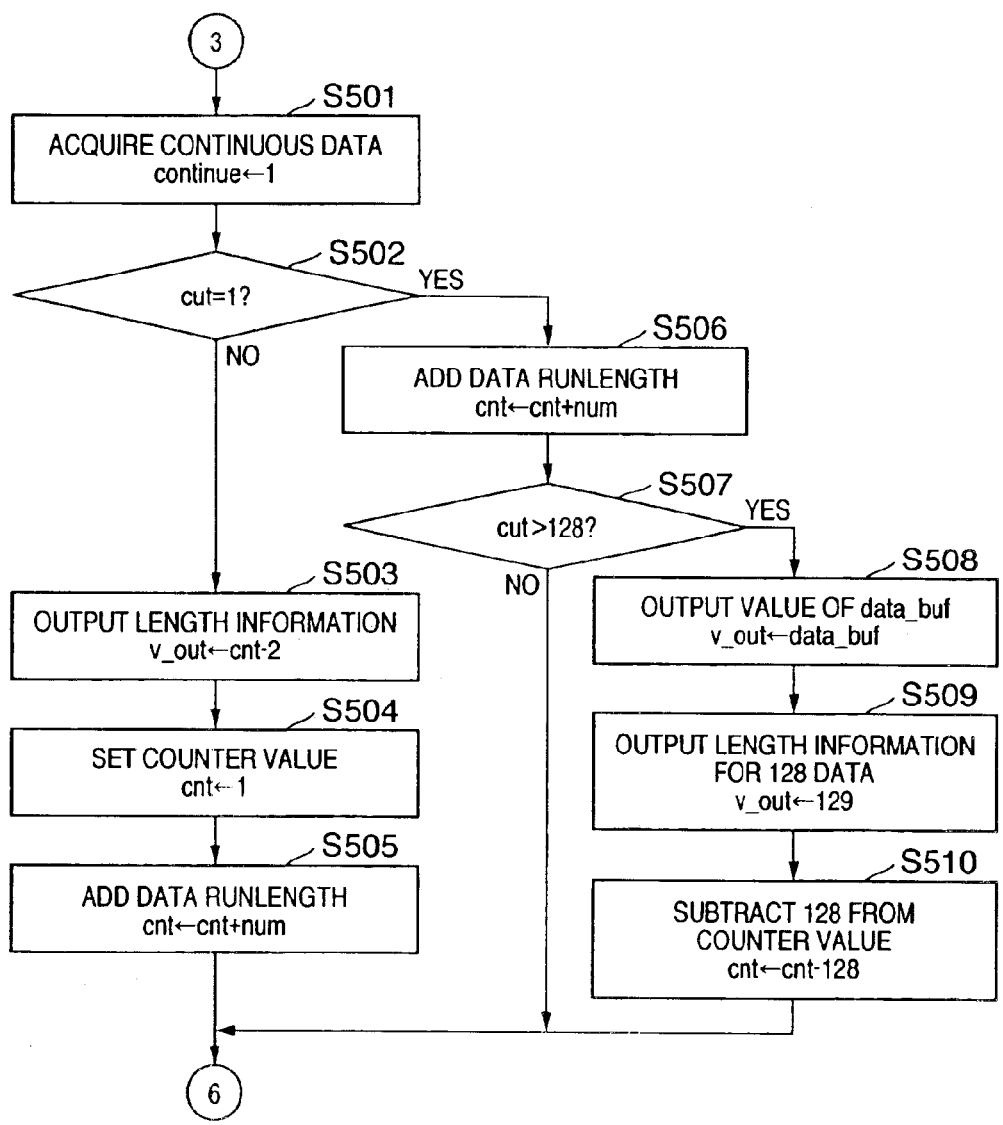
FIG. 5 is a flow chart showing the operation processing contents of the data combining unit 103 in the embodiment of the present invention.

FIG. 5 is a flow chart showing a process executed when internal variable continue=0 and the data value input from masked_data is the same as the value of internal variable data_buf (YES in step S309 in FIG. 3).

In this case, since continue=0 until the immediately preceding process, the part "the same data do not run" has been processed. However, since the data value input from masked_data is the same as the value in internal variable data_buf, the part "the same data do not run" has ended at the position of the immediately preceding data. Hence, the data combining unit sets the value of internal variable continue to be 1 indicating a part "the same data run" (step S501), and refers to the value of internal variable cnt (step S502). If the value of cnt is not 1, the data combining unit must calculate and output the number of data of the part "different data run" which has been processed so far.

For this purpose, since the value currently stored in data_buf is included in the part "the same data run", the actual number of data of the part "the same data do not run" is obtained by decrementing internal counter cnt by 1. Also, since the length information indicating a "runlength of different data" is a value obtained by decreasing 1 from the "runlength of different data", the data combining unit 2 subtracts 2 from internal variable cnt to calculate length information, and outputs that length information from v_out (step S503).

Since the same data as the data value input from masked_data is stored in data_buf, the data combining unit sets internal variable cnt to be 1 (step S504), and adds the data runlength input from num to cnt (step S505), thus preparing for reception of the next data. The flow then returns to step S306 in FIG. 3.

If it is determined in step S502 that cnt=1, the data combining unit adds the data runlength input from num to the value of cnt (step S506).

In this embodiment, since PackBits encoded data is expressed by 8 bits, the maximum runlength of the part "the same data run" that can be expressed is 128. For this reason, if the value of internal variable cnt is 129 or more, information indicating that 128 data run as the part "the same data run" must be output. Hence, the data combining unit refers to the value of internal variable cnt (step S507). If cnt≧129, the data combining unit outputs the data value stored in data_buf from v_out (step S508), and outputs 129 (81h) as length information indicating that the same 128 data run" from v_out after that data value (step S509). Note that the length information "129" may be obtained by looking up a table that stores the length information and codes that have been explained in the prior art, or may be calculated since the length information indicating that the same n data run is given by:

$$256-n+1$$

After the length information is output in step S508, the data combining unit decreases "128" corresponding to PackBits encoded data output to the subsequent unit from internal variable cnt (step S510) to prepare for reception of the next data. The flow then returns to step S306 in FIG. 3.

If it is determined in step S507 that the value of internal variable cnt is less than 129, the flow returns to step S306 in FIG. 3.

In this case, since the data value required for PackBits encoding has already been stored in data_buf, the data value input from masked_data need not be stored in internal variable data_buf, but it may be stored.

Figure 6:
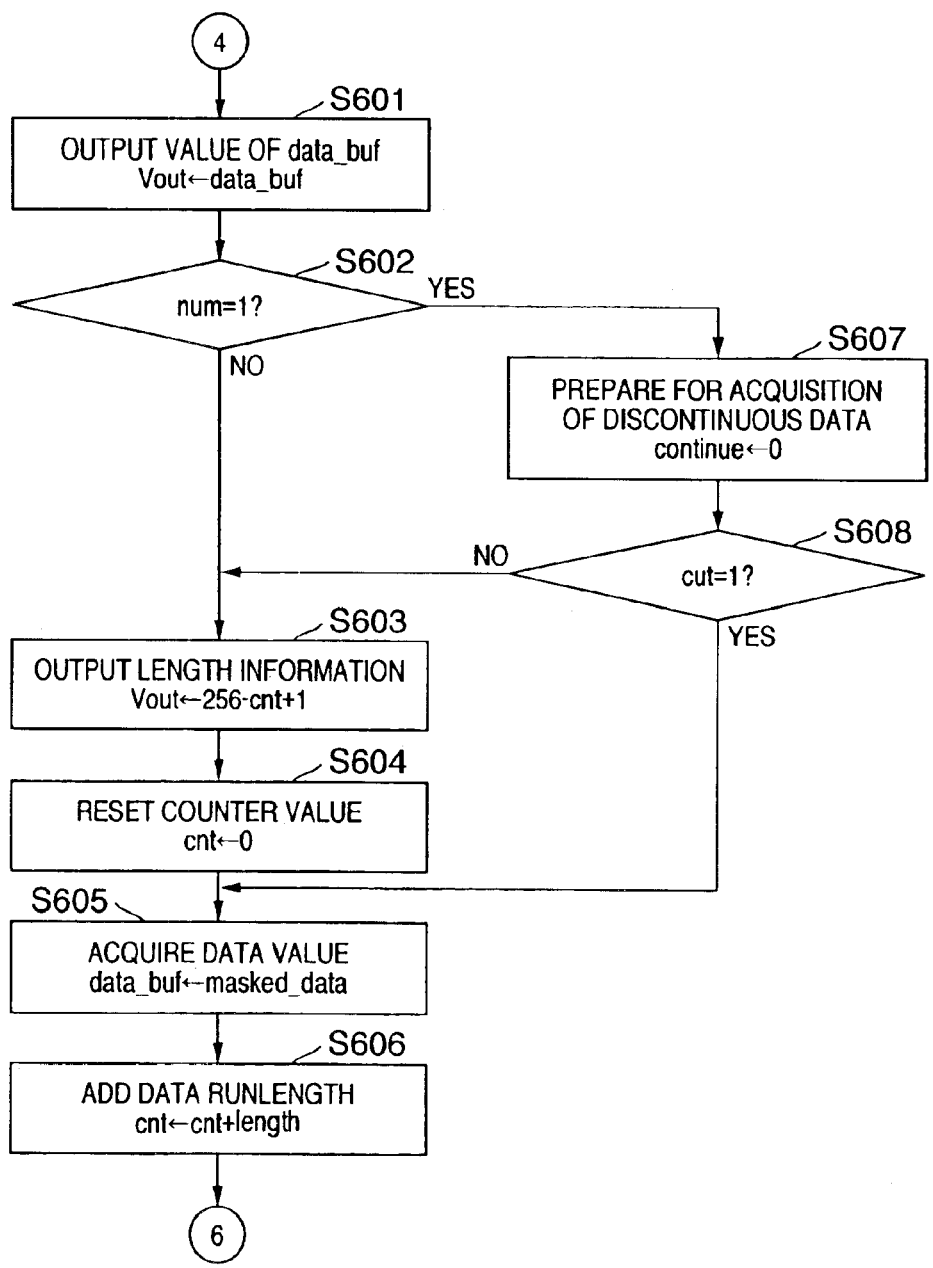
FIG. 6 is a flow chart showing the operation processing contents of the data combining unit 103 in the embodiment of the present invention.

FIG. 6 is a flow chart showing a process executed when internal variable continue=1 and the data value input from masked_data is different from the value of internal variable data_buf (NO in step S310 in FIG. 3).

In this case, since a data value input from masked_data is different from the value in data_buf, the part "the same data run" ends here. For this reason, the data combining unit outputs the value stored in data_buf from v_out (step S601). The data combining unit then refers to the data runlength input from num (step S602).

If the data runlength is other than 1, since it indicates that one or more values input from masked_data run, another part "the same data run" starts. For this reason, the data combining unit does not change the value of internal variable continue, i.e., 1 indicating the part "the same data run", calculates length information from internal counter cnt which stores the number of data of the previous part "the same data run" (by decreasing the value of cnt from 256 and adding 1 to the difference), and outputs that length information from v_out (step S603).

After that, the data combining unit resets internal variable cnt to zero (step S604). The data combining unit acquires a new data value from masked_data and stores it in data_buf (step S605), and adds the data runlength input from num to cnt (step S606). Upon completion of preparation for reception of the next data in this way, the flow returns to step S306 in FIG. 3.

If it is determined in step S602 that the data runlength input from num is 1, it indicates that a part "the same do not run" is to start. In this case, the data combining unit sets the value of internal variable continue to be zero indicating a part "the same do not run" (step S607), and refers to the value of internal variable cnt (step S608).

If the value of cnt is other than 1, the data combining unit calculates length information form internal counter cnt that stores the number of data of the part "the same data run" (by decreasing the value of cnt from 256 and adding 1 to the difference), and outputs that length information from v_out (step S603).

After that, the data combining unit resets internal variable cnt to zero (step S604). The data combining unit acquires a new data value from masked_data and stores it in data_buf (step S605), and adds the data runlength (1 in this case) input from num to cnt (step S606). Upon completion of preparation for reception of the next data in this way, the flow returns to step S306 in FIG. 3 to check the end of data input.

If it is determined in step S608 that the value of internal variable cnt is 1, the process is done to have the data value output in step S601 as the first data of the part "the same data do not run". Hence, the data combining unit acquires a new data value from masked_data and stores it in data_buf (step S605), and adds the data runlength (1 in this case) input from num to cnt (step S606). Upon completion of preparation for reception of the next data in this way, the flow returns to step S306 in FIG. 3.

Figure 7:
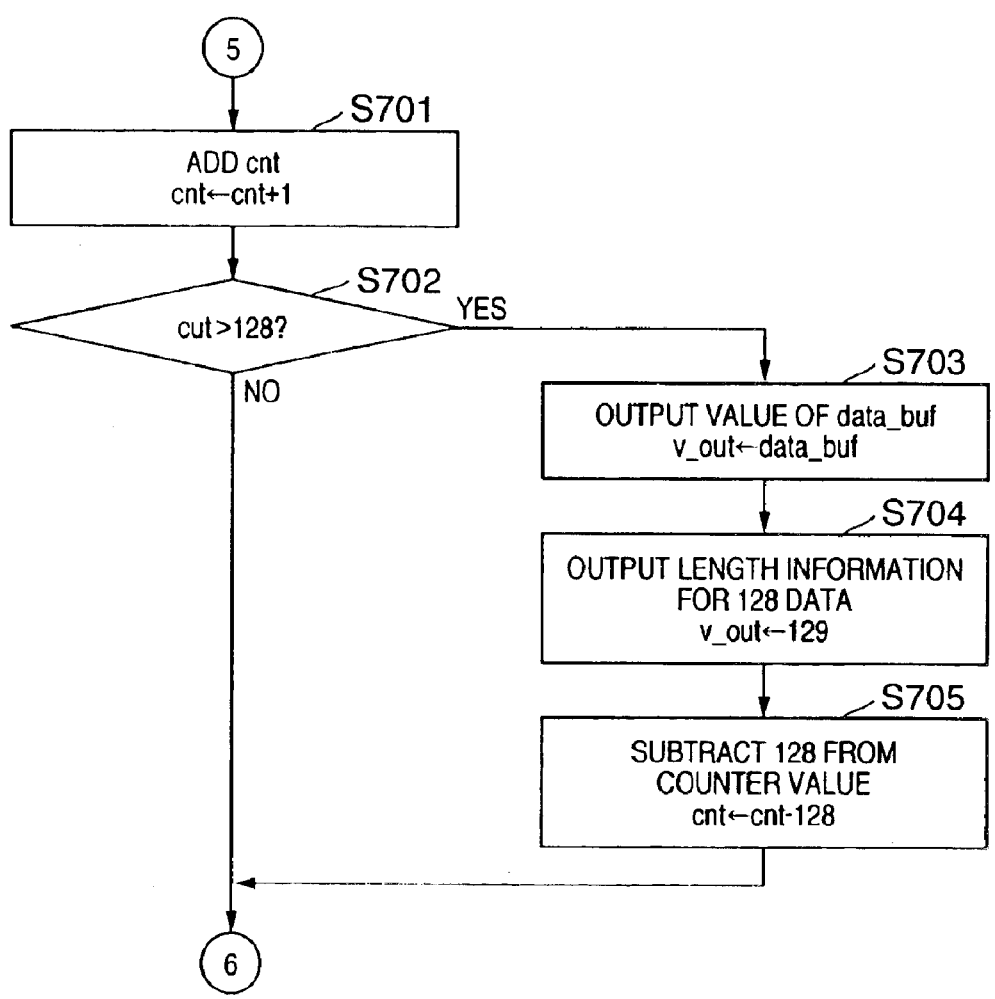
FIG. 7 is a flow chart showing the operation processing contents of the data combining unit 103 in the embodiment of the present invention.

FIG. 7 is a flow chart showing a process executed when internal variable continue=1 and the data value input from masked_data is the same as the value of internal variable data_buf (YES in step S310 in FIG. 3).

In this case, since the data value input from masked_data is the same as the value in data_buf, the part "the same data run" further continues. Hence, the data combining unit adds the data runlength input from num to internal variable cnt to calculate the runlength of data (step S701).

In this embodiment, since PackBits encoded data is expressed by 8 bits, the maximum runlength of the part "the same data run" and part "the same data do not run" that can be expressed is "128", as has been explained in the description of FIG. 5. For this reason, if the value of internal variable cnt is 129 or more, information indicating that 128 data run as the part "the same data run" must be output. Hence, the data combining unit refers to the value of internal variable cnt (step S702). If cnt≧129, the data combining unit outputs the data value stored in data_buf from v_out (step S703), and outputs "129 (81h)" as length information indicating that the same 128 data run" from v_out after that data value (step S704). Note that the length information "129" may be obtained by looking up a table that stores the length information and codes that have been explained in the prior art, or may be calculated since the length information indicating that the same n data run is given by:

$$256-n+1$$

After the length information is output in step S704, the data combining unit decreases "128" corresponding to PackBits encoded data output to the subsequent unit from internal variable cnt (step S705) to prepare for reception of the next data. The flow then returns to step S306 in FIG. 3.

If it is determined in step S702 that the value of internal variable cnt is 128 or less, the flow returns to step S306 in FIG. 3 to check the end of data input, since no data required for PackBits encoding is generated.

In this case, since the data value required for PackBits encoding has already been stored in data_buf in the flow chart of FIG. 7, the data value input from masked_data need not be stored in internal variable data_buf, but it may be stored.

Figure 8:
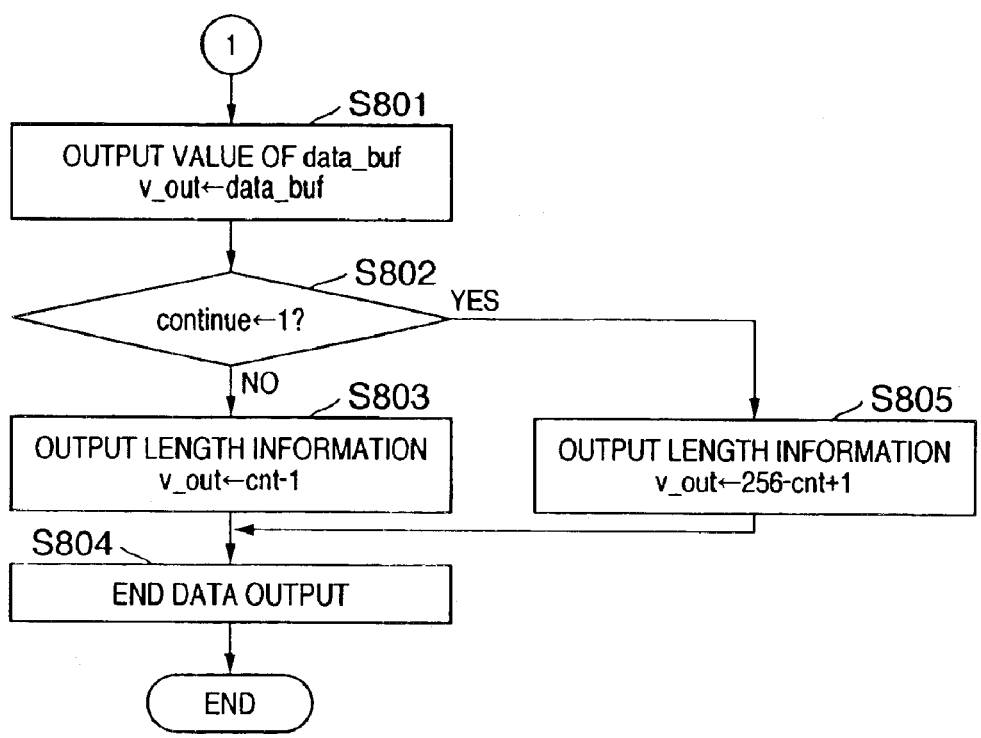
FIG. 8 is a flow chart showing the operation processing contents of the data combining unit 103 in the embodiment of the present invention.

FIG. 8 is a flow chart showing a process executed when it is determined in step S306 in FIG. 3 that data input ends since 1 is input from end (118).

In FIG. 8, the data combining unit outputs the data value stored in internal variable data_buf from v_out (step S801), and then refers to the value of internal variable continue (step S802).

If continue=0, since the data value output in step S801 is the last data value of the part "the same data do not run", the data combining unit generates and outputs length information of the part "different data run". More specifically, the data combining unit decreases 1 from the value of internal variable cnt, and outputs that value from v_out (step S803).

The data combining unit then outputs 1 to v_end (134) so as to notify the subsequent unit of the end of data output (step S804), thus ending its operation.

On the other hand, if it is determined in step S802 that continue=1, since the data value output in step S801 is that of the part "the same data run", the data combining unit calculates and outputs length information of the part "the same data run" from internal variable cnt. More specifically, the data combining unit calculates:

$$256-cnt+1$$

using the value of internal variable cnt, and outputs that value from v_out (step S805).

After that, the data combining unit then outputs 1 to v_end (134) so as to notify the subsequent unit of the end of data output (step S804), thus ending its operation.

In FIGS. 3 to 8, when the data combining unit 103 of this embodiment outputs a data value stored in internal variable data_buf from v_out, it simultaneously outputs 1 from d_valid (131). Also, when the unit 103 outputs length information generated based on internal variable cnt from v_out, it simultaneously outputs 1 from l_valid (132). With these signals, the data combining unit notifies the subsequent unit of the valid signal of data output from v_out (133) and whether the data output from v_out is a data part of PackBits encoded data or length information.

Also, in FIGS. 3 to 8, when two data, i.e., a data part and length information, must be output from v_out by acquiring the data runlength and data value from num and data as in step S603 in FIG. 6 or step S704 in FIG. 7, the data combining unit must stop inputs of the data runlength and data from the data division unit 101 and image processing unit 102 by setting ready (117) to be zero (i.e., it does not issue the input request of the next data) until an output from v_out ends.

Figure 11:
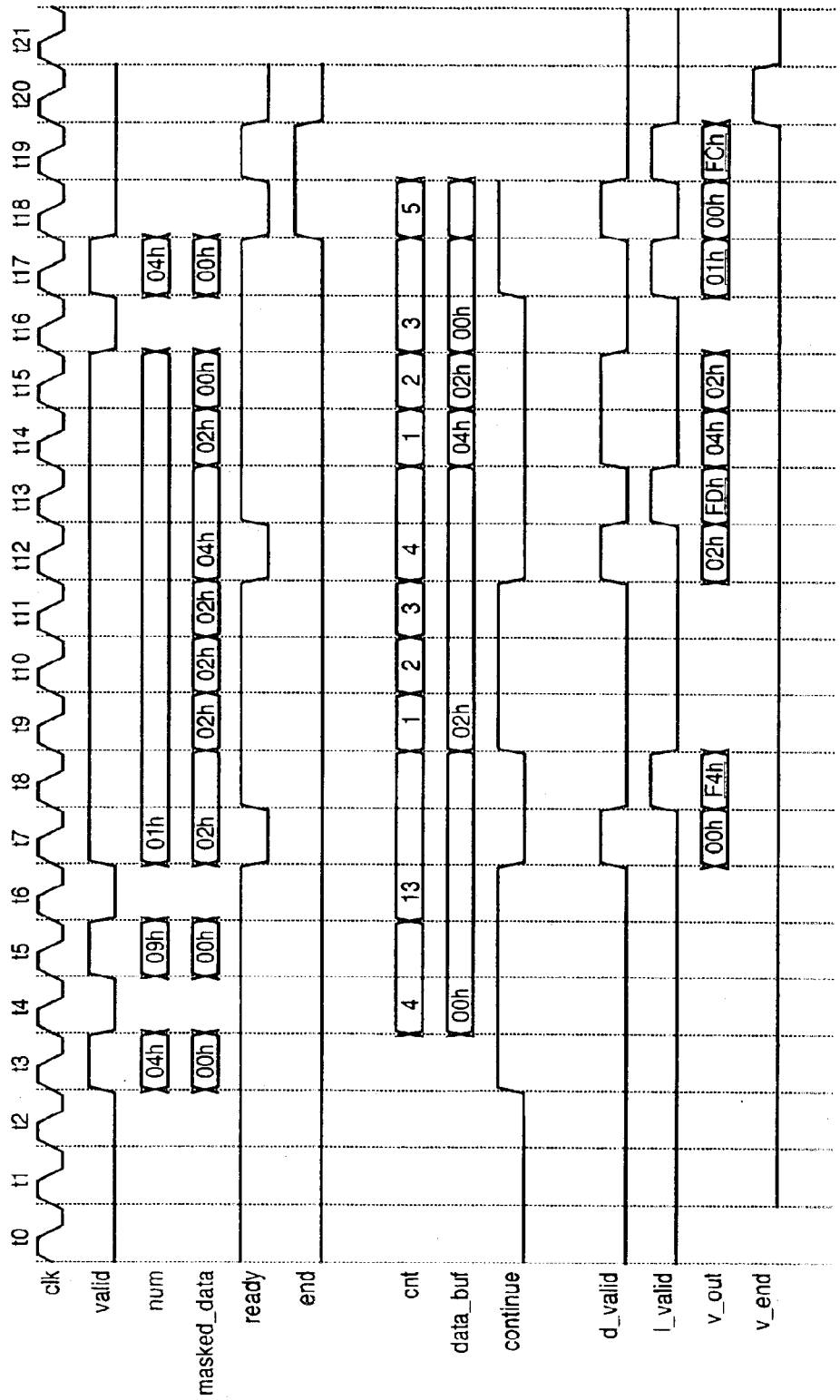
FIG. 11 is an input/output timing chart of the data combining unit 103 in the embodiment of the present invention.

FIG. 11 shows an example of an input/output timing chart of the data combining unit 103 of this embodiment.

Referring to FIG. 11, clk represents clocks, and respective signals are input/output in synchronism with clk. Signals valid, num, masked_data, ready, and end are those used to input the data runlength generated by the data division unit and a data value generated by the data processing unit 102 to the data combining unit 103.

Also, cnt, data_buf, and continue are internal variables used in the data combining unit, and signals d_valid, l_valid, v_out, and v_end are those used to output the data part and length information of PackBits encoded data to the data output unit 104.

In FIG. 11, each length information of PackBits encoded data output from v_out is indicated by a double underline.

When the first data runlength and data value are input from num and masked_data at timing t3 in FIG. 11 (step S301), the data combining unit 103 stores 4 (04h) input from num in internal variable cnt, and 0 (00h) input from masked_data in internal variable data_buf (step S302).

The data combining unit refers to the value of cnt in step S303. Since cnt≠1, the data combining unit sets internal variable continue to be 1 in step S304.

The data combining unit checks the end of data input in step S306. Since 1 is not input from end, the data combining unit waits for the next data runlength and data value input from num and masked_data.

When "9 (09h)" and "0 (00h)" are input from num and masked_data at timing t5 (step S307), the data combining unit 103 refers to the value of internal variable continue in step S308. Since continue=1, the flow advances to step S310, and the data combining unit compares the data value input from masked_data with the value stored in data_buf. Since both the data value from masked_data and the value in data_buf are 0 (00h), i.e., they are equal to each other, the operation of the data combining unit advances to step S701 in FIG. 7.

The data combining unit adds the value of internal variable cnt and the data runlength input from num in step S701, and compares the value of cnt after addition with 129 (step S702). As a result of addition, since the value of internal variable cnt is 13 (00h), as indicated by timing t6 in FIG. 11, and is smaller than 129, the flow returns to step S306 in FIG. 3.

At timing t6, the data combining unit checks the end of data input again in step S306. Since 1 is not input from end, the data combining unit waits for the next data runlength and data value input from num and masked_data.

When "1 (01h)" and "2 (02h)" are input from num and masked_data at timing t7 (step S307), the data combining unit 103 refers to the value of internal variable continue in step S308. Since continue=1, the flow advances to step S310, and the data combining unit compares the data value input from masked_data with the value stored in data_buf. At timing t7, since the data value from masked_data is different from the value in data_buf, the operation of the data combining unit advances to step S601 in FIG. 6.

The data combining unit outputs the value stored in data_buf simultaneously with setting 1 in d_valid in step S601, and then refers to the value input from num (step S602). Since num=1, the data combining unit sets internal variable continue to be zero in step S607 to prepare for start of a part "the same data do not run".

In step S608, the data combining unit refers to the value of internal variable cnt. Since cnt≠1 (01h), the data combining unit calculates in step S603 length information by:

256−13+1

The data combining unit then outputs 244 (F4h) from v_out simultaneously with setting 1 in l_valid. The data combining unit resets internal variable cnt to zero (step S604), stores 2 (02h) as the data value input from masked_data in data_buf (step S605), and adds the data runlength "1 (01h)" input from num to cnt (cnt=1 (01h)). The flow then returns to step S306 in FIG. 3.

Note that the aforementioned operations are done at the following timings: output of the value of data_buf in step S601 at timing t7; the operation for resetting internal variable continue to zero in step S607 at timing t7; output of length information in step S603 at timing t8; and acquisition of a data value and addition of the data runlength in steps S605 and S606 at timing t8.

As for the data runlength and data value input from num and masked_data at timing t7, since two data, i.e., the data part and length information, must be output from v_out of the data combining unit, 1 is output from ready of the data combining unit at timing t7 to hold the values input from num and masked_data at timing t7 until timing t8, and required values are acquired from num and masked_data at timing t8.

When "1 (01h)" and "2 (02h)" are input from num and masked_data as the next data at timing t9, the data combining unit refers to the value of continue in step S308. Since continue=0 at timing t8, the data combining unit compares the value "2" input from masked_data with the value of data_buf in step S309. Since the value of data_buf at timing t8 is "2", the operation of the data combining unit advances to step S501 in FIG. 5.

The data combining unit sets the value of internal variable continue to be 1 that indicates a part "the same data run" in step S501, and refers to the value of internal variable cnt in step S502. At this time, since cnt=1, the flow advances to step S506, and the data combining unit adds the value of cnt to the data runlength input from num. Since num=1 (01h) at timing t9, a new value of cnt is 2 (02h).

In step S507, the data combining unit refers to the value of cnt. At this time, since cnt=2, as described above, and is smaller than 129, the flow returns to step S306 in FIG. 3.

Since the input values and operations at timings t10 and t11 are the same as those at timing t9, a description thereof will be omitted. With the operations at timings t10 and t11, the value of internal variable cnt becomes 3 (03h) at timing t11 and 4 (04h) at timing t12, and the value of continue remains unchanged from 1.

When "1 (01h)" and "4 (04h)" are input from num and masked_data at timing t12, the operation of the data combining unit advances from step S307 to step S308, and then advances to step S310 since internal variable continue is 1. The data combining unit compares 4 as a value input from masked_data with 2 as a value stored in data_buf. Since these values are different from each other, the flow advances to step S601 in FIG. 6.

The data combining unit outputs 2 (02h) as the value of data_buf from v_out in step S601. Since the data runlength input from num is 1, the flow advances from step S602 to step S607. The data combining unit sets continue to be zero to indicate that "the same data do not run", and refers to the value of cnt in step S608. Since the value of cnt is 4 (04h) at timing t12, the flow advances to step S603, and the data combining unit calculates length information indicating a "runlength of the same data" from the value of cnt, and outputs it from v_out. After the data combining unit resets cnt in step S604, it stores 4 (04h) as the data value from masked_data in data_buf, and adds the data runlength "1 (01h)" input from num to cnt after reset. The flow then returns to step S306 in FIG. 3.

Note that the aforementioned operations are done at the following timings: output of the value in data_buf in step S601 at timing t12; the operation for setting internal variable continue to be zero in step S607 at timing t12; output of the length information in step S603 at timing t13; and acquisition of the data value and addition of the data runlength in steps S605 and S606 at timing t13.

As for the data runlength and data value input from num and masked_data at timing t12, since two data, i.e., the data part and length information, must be output from v_out of the data combining unit, 1 is output from ready of the data combining unit at timing t12 to hold the values input from num and masked_data at timing t12 until timing t13, and required values are acquired from num and masked_data at timing t13.

When "1 (01h)" and "2 (02h)" are input from num and masked_data at timing t14, the operation of the data combining unit advances from step S307 to step S308, and then advances to step S309 since internal variable continue is 0. The data combining unit compares 2 as a value input from masked_data with 4 as a value stored in data_buf. Since these values are different from each other, the flow advances to step S401 in FIG. 4.

The data combining unit outputs 4 (04h) as the value of data_buf from v_out in step S401. Since the data runlength input from num is 1, the flow advances from step S402 to step S408. In this case, since the value of internal variable cnt is 1 (01h), the flow advances from step S408 to step S406, and the data combining unit adds the value of num to internal variable cnt (as a result, cnt=2). After the data combining unit stores a value input from masked_data in data_buf in step S407, the flow returns to step S306 in FIG. 3.

At timing t15, the data combining unit makes the same operations as those at timing t14. As a result, "2 (02h)" is output from v_out, the value of internal variable cnt is incremented by 1 to 3, and the value of data_buf becomes 0 (00h) input from masked_data.

When "4 (04h)" and "0 (00h)" are input from num and masked_data at timing t17, the operation of the data combining unit advances from step S307 to step S308, and then advances to step S309 since internal variable continue is 0. The data combining unit compares 0 as a value input from masked_data with 0 as a value stored in data_buf. Since these values are equal to each other, the flow advances to step S501 in FIG. 5.

The data combining unit sets the value of internal variable continue to be 1 that indicates a part "the same data run" in step S501, and refers to the value of internal variable cnt in step S502. At this time, since cnt=3, the flow advances to step S503, and the data combining unit calculates length information indicating a "runlength of different data" from the value of cnt. More specifically, the data combining unit outputs 1 (01h) obtained by subtracting 2 from 3 as the value of cnt as length information from v_out.

The data combining unit 503 sets cnt to be 1 in step S503, and adds 4 as the data runlength input from num to the value of cnt to yield 5 (05h) in step S504. The flow then returns to step S306 in FIG. 3.

When 1 is input from end (118) at timing t18, the data combining unit determines the end of data input in step S306, and the flow advances to step S801 in FIG. 8 to execute a process for ending the operation.

After the data combining unit outputs the data value stored in data_buf from v_out in step S801, it refers to the value of internal variable continue in step S802. Since the value of continue at timing t18 is 1, the flow advances to step S805, and the data combining unit generates length information indicating a "runlength of the same data" on the basis of the value of cnt. More specifically, the data combining unit calculates 252 (FCh) as length information by substituting 5 (05h) as the value of cnt in:

256−cnt+1

The data combining unit then outputs the calculated value from v_out.

After that, the data combining unit outputs 1 from v_end in step S804 to inform the subsequent unit of the end of data output, thus ending the operation.

Note that the aforementioned operations are done at the following timings: output of the value of data_buf in step S801 at timing t18; output of length information in step S805 at timing t19; and output of 1 from v_end in step S804 at timing t20.

In the state in which 1 is input from end at timing t18, two data, i.e., the data part and length information, must be output from v_out of the data combining unit. Hence, 1 is output from ready of the data combining unit at timing t18 to hold the state of end input at timing t18 until timing t19. In this way, the data combining unit confirms the end of data input.

With the above operations, the data combining unit 103 of this embodiment outputs PackBits encoded data in an order "data value+runlength" or "different data stream+runlength of different data" opposite to "runlength+data value" or "runlength of different data+different data stream" as the normal order of PackBits encoded data.

The data output unit 104 rearranges the order of the length information and data part of the encoded data output from the data combining unit 103 to obtain a normal order of PackBits encoded data, and outputs the rearranged data.

Figure 9:
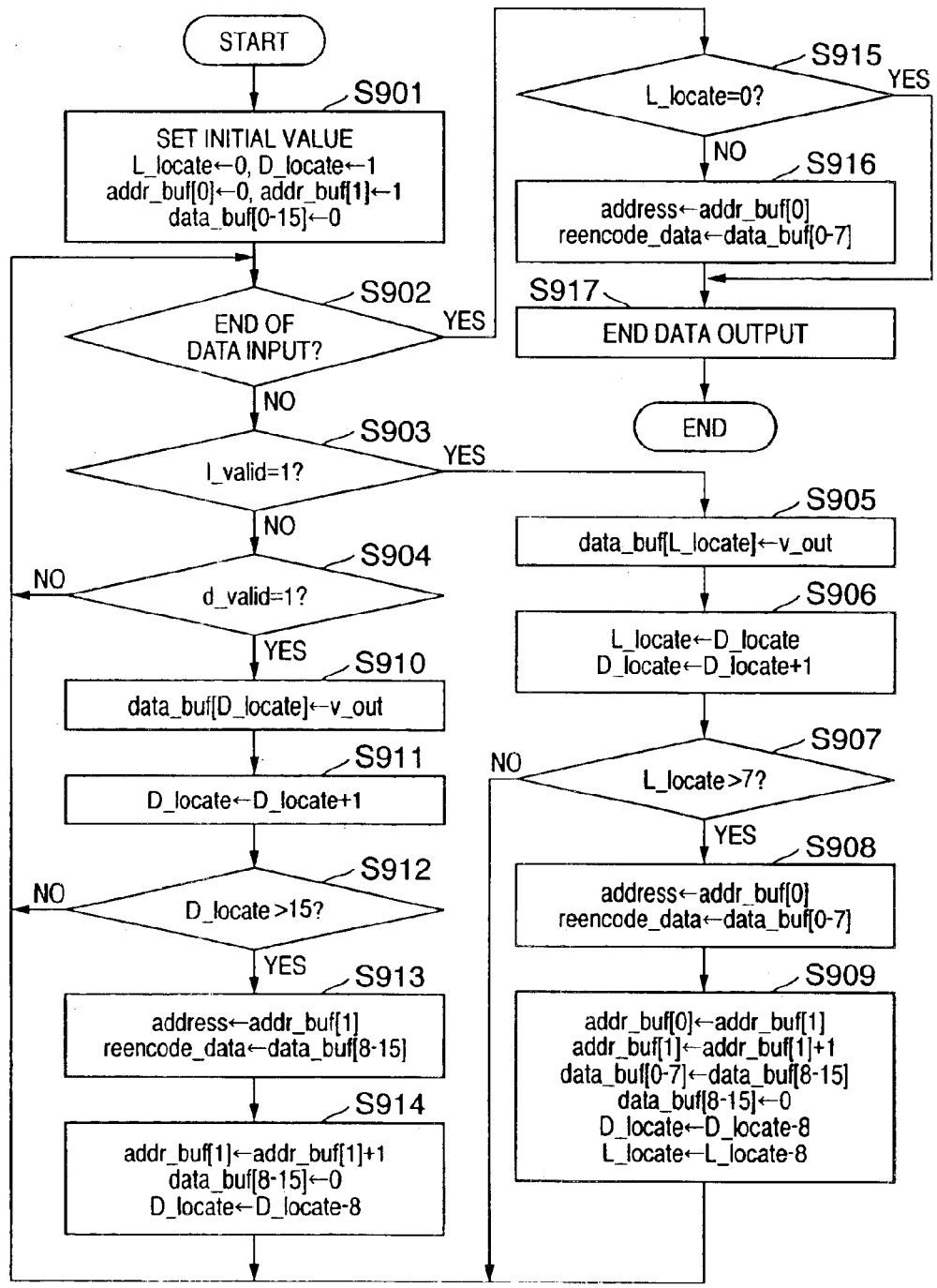
FIG. 9 is a flow chart showing the operation processing contents of a data output unit 104 in the embodiment of the present invention.

FIG. 9 is a flow chart showing the processing sequence to be executed by the data output unit 104 of this embodiment.

When the operation starts, the data output unit initializes internal variables (step S901). The internal variables of the data output unit in this embodiment include L_locate indicating a buffer that stores length information input from v_out, D_locate indicating a buffer that stores a data value of a data part input from v_out, 16 8-bit data buffers data_buf[15] to data_buf[0] that store the length information and the data value of the data part, address buffer addr_buf[1] indicating the output destination address upon outputting the contents of data_buf[15] to data_buf[8], and address buffer addr_buf[0] indicating the output destination address upon outputting the contents of data_buf[7] to data_buf[0].

In step S901, the data output unit initializes these internal variables like:

L_locate=0
D_locate=1
addr_buf[0]=0
addr_buf[1]=1
data_buf[15] to data_buf[0]=0

Upon completion of initialization of the internal variables, the data output unit checks if input of data from the data combining unit ends (step S902). The end of data input can be determined by checking if 1 is input from v_end in this embodiment. If 1 is input, the end of data input is determined.

If it is determined in step S902 that data input does not end (v_end=0), the data output unit waits for data input from v_out. In this embodiment, when length information is input from v_out, 1 is input from l_valid; when the data value of a data part is input, 1 is input from d_valid. Hence, the data output unit waits for data input from v_out with reference to the value of l_valid (step S903) and the value of d_valid (step S904). Then, steps S902 to S904 in FIG. 9 are repeated until data input ends in response to 1 input from v_end, or until l_valid or d_valid changes to 1 and data is input from v_out.

If it is detected in step S903 that 1 is input from l_valid, the data output unit stores length information input from v_out in data_buf of a number designated by L_locate (to be referred to as data_buf[L_locate] hereinafter) (step S905), stores the value indicated by D_locate in L_locate as a new length information storage location, and increments the stored value of D_locate by 1 (step S906).

In step S907, the data output unit refers to the value of L_locate set in step S906. In this embodiment, since data buffers with numbers smaller than the value of L_locate have already stored data, if the value of L_locate is larger than 7, this means that all data buffers data_buf[7] to data_buf[0] store values.

For this reason, the data output unit outputs the value of address buffer addr_buf[0] indicating the storage location of data_buf[7] to data_buf[0] from address, and outputs the values in data_buf[7] to data_buf[0] from reencode_data (step S908).

Then, the data output unit stores the address stored in addr_buf[1] in addr_buf[0] as a new address, and increments the stored value of addr_buf[1] by 1. The data output unit substitutes the values stored in data_buf[15] to data_buf[8] in data_buf[7] to data_buf[0], and resets data_buf[15] to data_buf[8] to zero. Furthermore, the data output unit subtracts 8 from the values of D_locate and L_locate (step S909).

In this manner, since preparation for acquisition of the next data is complete, the flow returns to step S902, and the data output unit waits for 1 input from v_end or new data input from v_out.

If the value of L_locate referred to in step S907 is equal to or smaller than 7, the flow directly returns to step S902, and the data output unit waits for 1 input from v_end or new data input from v_out.

On the other hand, if it is detected in step S903 that l_valid=0 and it is detected in step S904 that d_valid=1, the data output unit stores the data value of a data part input from v_out in data_buf with a number designated by D_locate (to be referred to as data_buf[D_locate] hereinafter) (step S910), and increments the stored value of D_locate by 1 (step S911).

The data output unit refers to the value of D_locate set in step S911 (step S912). In this embodiment, since L_locate in steps S902, S903, and S904 assumes only a value equal to or smaller than 7, if the value of D_locate is larger than 5, this means that all data buffers data_buf[15] to data_buf[8] store values.

For this reason, the data output unit outputs the value of address buffer addr_buf[1] indicating the storage destination of data_buf[15] to data_buf[8] from address, and outputs the values of data_buf[15] to data_buf[8] from reencode_data (step S913).

The data output unit increments the stored value of addr_buf[1] by 1, resets the contents of data_buf[15] to data_buf[8] to zero, and subtracts 8 from the value of D_locate (step S914).

In this manner, since preparation for acquisition of the next data is complete, the flow returns to step S902, and the data output unit waits for 1 input from v_end or new data input from v_out.

If the value of D_locate referred to in step S912 is equal to or smaller than 15, the flow directly returns to step S902, and the data output unit waits for 1 input from v_end or new data input from v_out.

If 1 is input from v_end to indicate the end of data input in step S902, the data output unit refers to the value of L_locate (step S915). If the value of L_locate is other than 0, since data to be output still remain in some of data buffers data_buf[7] to data_buf[0], the data output unit outputs the value of address buffer addr_buf[0] indicating the storage destination of data_buf[7] to data_buf[0] from address, and outputs the values of data_buf[7] to data_buf[0] from reencode_data (step S916).

After that, the data output unit outputs 1 from reencode_end to inform the subsequent unit of the end of data output (step S917), thus ending the operation.

If it is determined in step S915 that the value of L_locate is zero, since no data to be output remains in the data buffers, the flow jumps to step S917. The data output unit outputs 1 from reencode_end to inform the subsequent unit of the end of data output, thus ending the operation.

Note that reencode_valid is set to be 1 upon outputting data from reencode_data or an address from address in steps S909 and S914 in the above description.

Figure 13:
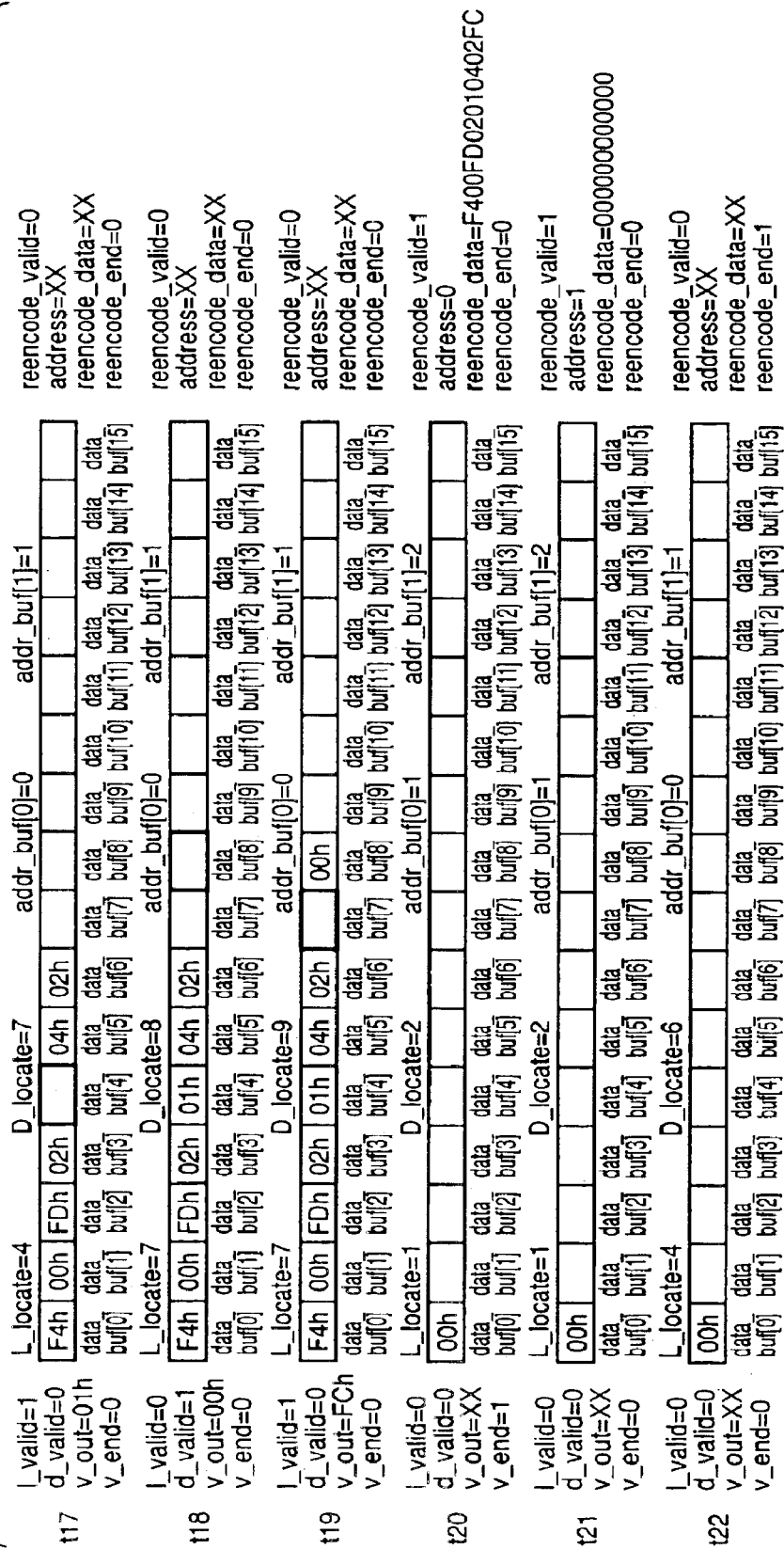
FIG. 13 is a transition chart of internal states upon operation of the data output unit 104 in the embodiment of the present invention.

FIGS. 12 and 13 show the operations of the data output unit 104 of this embodiment when d_valid, l_valid, and v_end are input to the data output unit 104 at the timings shown in FIG. 11, and also show transition of the values of internal variables and output signals.

The uppermost view of FIG. 12 shows the state of the data output unit at timing t0 in FIG. 11. In the uppermost view of FIG. 12, reference numeral 1201 denotes a time (timing) in FIG. 11; and 1202, the input values to the data output unit at the time 1201. Reference numeral 1202 denotes values of internal variables at the time 1201; and 1203, the output values from the data output unit at the time 1201. Note that timing t0 in FIG. 12 shows a state wherein the internal variables are initialized in step S901 in FIG. 9. Note that the values of data_buf[0] to data_buf[15] are set to be zero, but their values are indicated by blank so as to distinguish them from data input from v_out at timing to.

Timing t7 shows a state wherein the data value of a data part is input from v_out. At this time, the data output unit 104 detects d_valid=1 in step S904. Also, since the value of D_locate is 1, the data output unit stores the value input from v_out in data_buf[1] in step S910, and increments the value of D_locate by 1 to yield 2 in step S911. After that, the data output unit refers to the value of D_locate in step S912. Since D_locate≦15, the flow returns to step S902. After the above operations, a state shown in timing t8 is set.

Timing t8 in FIG. 12 shows a state wherein length information is input from v_out. At this time, the data output unit 104 detects l_valid=1 in step S903. Also, since the value of L_locate is zero, the data output unit stores the value input from v_out in data_buf[0] in step S905, stores the value "2" stored in D_locate in L_locate, and increments the value "2" of D_locate by 1 to yield 3 in step S906.

After that, the data output unit refers to the value of L_locate in step S907. Since L_locate≦7, the flow returns to step S902. The states of internal variables after the above operations are as shown in timing t12.

Likewise, since 1 is input from d_valid at timings t12, t14, and t15, and timing t18 in FIG. 13, the data output unit stores a data value of the data part input from v_out in data_buf designated by the value of D_locate, and increments the value of D_locate by 1.

At timing t17, since 1 is input from 1_valid, the data output unit stores length information input from v_out in data_buf designated by the value of L_locate, stores the value of D_locate in L_locate, and increments the value of D_locate by 1.

At timing t19, length information is input from v_out. At this time, since the value of L_locate is 7, the data output unit stores a value "FCh" input from v_out in data_buf[7] in step S905, and then stores "9" as the value of D_locate in L_locate and "10" in D_locate in step S906.

At this time, when the data output unit refers to L_locate in step S907, since the value of L_locate is equal to or larger than 7, the data output unit outputs "0" as the value of addr_buf[0] from address, and the contents of data_buf[0] to data_buf[7] from reencode_data in step S908.

After that, the data output unit sets the contents of addr_buf[0] to be 1 stored in addr_buf[1], and increments the value of addr_buf[1] to yield 2 in step S909. Also, the data output unit sets the values stored in data_buf[8] to data_buf[15] in data_buf[0] to data_buf[7], and resets data_buf[8] to data_buf[15] to zero (indicated by blank in FIGS. 12 and 13). Furthermore, the data output unit subtracts 8 from the values of L_locate and D_locate to set the value of L_locate to be 1 and that of D_locate to be 2.

The operation results of steps S905 to S909 are shown in timing t20 in FIG. 13. Also, upon outputting n address and data from address and reencode_data in the above description, 1 is also output from reencode_valid.

Timing t20 in FIG. 13 shows a state wherein 1 is input from v_end. At this time, the data output unit 104 detects v_end=1 in step S902, and refers to the value of L_locate in step S905. Since the value of L_locate is 1 at timing t20, the data output unit outputs data which remain stored in data_buf[0] to data_buf[7]. For this purpose, the data output unit outputs 1 from reencode_data, 1 from address as the value of addr_buf[0], and the values of data_buf[0] to data_buf[7] from reencode_data.

After that, the data output unit outputs 1 from reencode_end in step S917, thus ending its operation.

In the above description, the operation results in step S916 are as shown in timing t21 in FIG. 13, and those in step S917 are as shown in timing T22 in FIG. 13.

As described above, according to this embodiment, the PackBits encoder receives PackBits encoded data, can apply a predetermined process to each data part of the PackBits encoded data, and can then execute a PackBits encoding process again (reconstruction of PackBits codes. For example, in this embodiment, 14 PackBits encoded data input from encode_data can be compressed to nine PackBits encoded data, as indicated by v_out in FIG. 11, since the data processing unit sets each least significant bit to zero.

Note that the above embodiment has explained PackBits encoding of image area information. Alternatively, each pixel value as image data may be used as an object to be encoded. In this case, in the aforementioned relationship between the overflow count and bits to be masked, N bits (N=overflow count) from the LSB to the MSB of a pixel value can be masked.

The above embodiment has explained PackBits encoding. However, since the present invention can be applied to encoding expressed by the runlength of the same data and that data, and the runlength of different data and that data stream, the present invention is not limited to the above embodiment.

<Second Embodiment>

Figure 16:
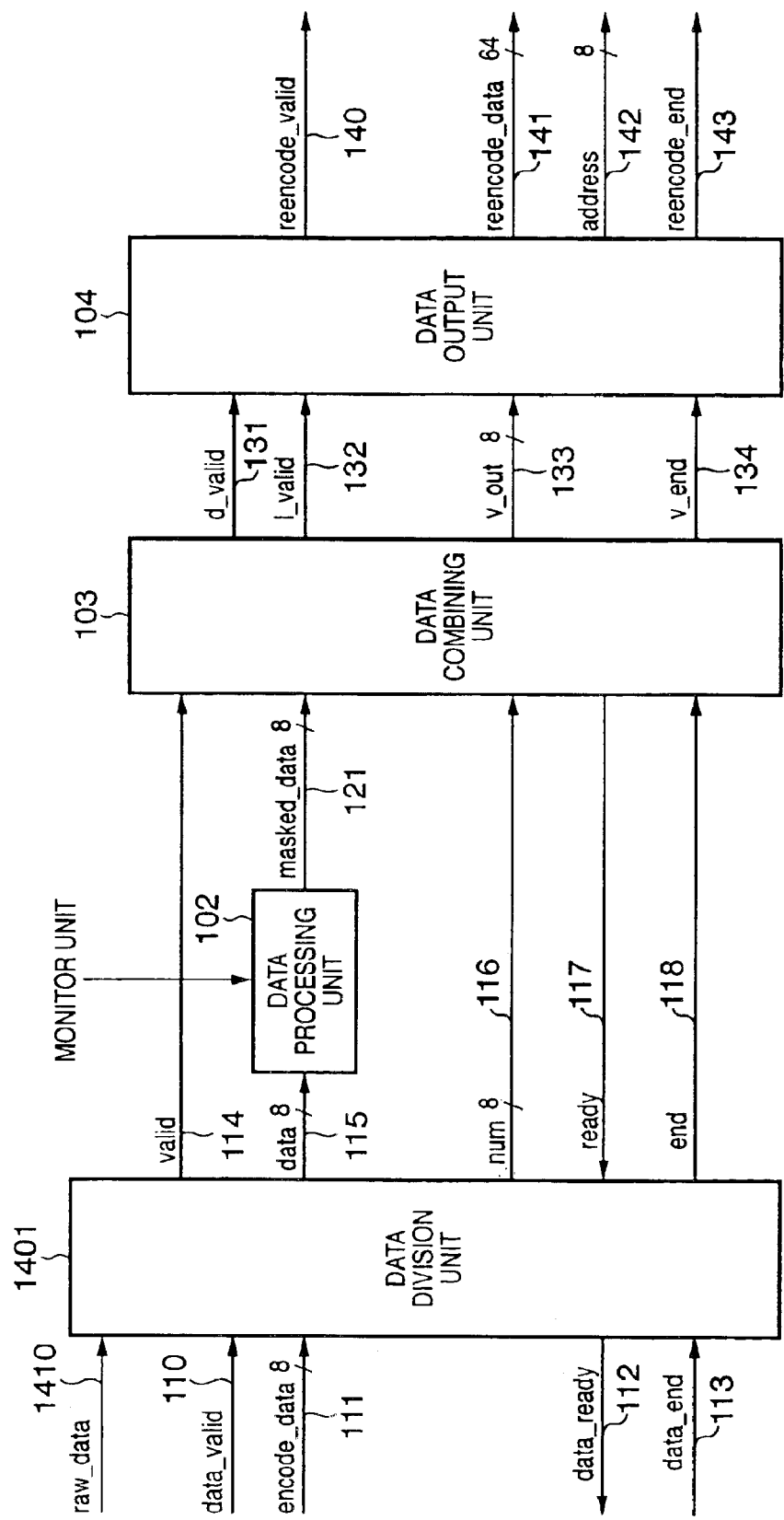
FIG. 16 is a block diagram of a PackBits re-encoder according to the second embodiment of the present invention.

FIG. 16 shows another example (second embodiment) of the PackBits re-encoder of the present invention.

In the PackBits encoder in FIG. 16, in order to receive not only PackBits encoded data from encode_data but also raw data before PackBits encoding, a raw_data signal (1410) is added to a data division unit 1401.

In the PackBits encoder of the second embodiment, when 0 is input from raw_data, the data division unit 1401 executes the operation when PackBits encoded data is input from encode_data (111), as shown in FIG. 2. When 1 is input from raw_data, the data division unit 1401 executes the operation when raw data before PackBits encoding is input from encode_data (111).

The operation of the data division unit 1401 upon reception of raw data will be described in detail below. When raw data is input from encode_data (111), input data is output from data (115) to the data processing unit 102, and 1 (01h) is output as a data runlength from num (116) at the same time.

In this way, the data combining unit 103 and data output unit 104 execute a PackBits encoding process to have a data value, which is output from the data division unit 1401 and is processed by the data processing unit 102, as data with a "data runlength=1".

With the above arrangement, the PackBits encoder shown in FIG. 16 can receive either PackBits encoded data or raw data, and can generate and output PackBits encoded data.

As described above, according to the first and second embodiments, PackBits encoded data is divided into length information and a data part without being decoded, a given process is applied to a data value or values of the data part, and new PackBits encoded data can be reconstructed using the processed data value or values and the length information. A large memory is not required upon re-encoding, and high-speed re-encoding can be realized.

In the above embodiments, the present invention is applied to a copying machine, but is not limited to this.

Furthermore, in the above embodiments, a bit position to be masked (to be set to be zero) is determined upon re-encoding. Alternatively, such bit position may be set to be 1. That is, either positive or negative logic may be adopted. That is, each bit can be changed to decrease the number of types that data can assume upon re-encoding. This is because the same data are more likely to run, and a higher compression ratio can be expected.

The building components of the PackBits re-encoder 15 explained in the above embodiments have been explained using the flow charts. As can be seen from the above description, functions equivalent to those described above may be implemented by a computer program. That is, the scope of the present invention includes a computer program. Since a computer program becomes normally ready to run after a computer readable storage medium such as a CD-ROM or the like is set and the program is copied or installed in a system, such computer readable storage medium is also included in the scope of the present invention.

As described above, according to the above embodiments, encoded data (e.g., PackBits encoded data), which is expressed by a data format of a runlength code part indicating the runlength of the same data and a data part indicating the data, and a runlength code part indicating the runlength of a different data stream and a data part indicating the different data stream, can be re-encoded to the same data format at a higher compression ratio without decoding that encoded data.

As many apparently widely different embodiments of the present invention can be made without departing from the spirit and scope thereof, it is to be understood that the invention is not limited to the specific embodiments thereof except as defined in the claims.

What is claimed is:

1. An encoding method for re-encoding encoded data, which is represented by a data format of a runlength code part indicating a runlength of the same data and a data part indicating the data, and a runlength code part indicating a runlength of different data and a data part indicating the different data, to that data format, comprising:
    a step of inputting encoded data in the data format;
    a step of separating a runlength code part and a data part from the encoded data;
    a step of changing a desired bit in the separated data part;
    a step of reconstructing the data format on the basis of the changed data part and the runlength code part without decoding the input encoded data; and
    a step of outputting the reconstructed data as re-encoded data.

2. The method according to claim 1, further comprising a step of designating a bit position to be changed in said step of changing a desired bit.

3. The method according to claim 2, wherein said designation step includes a step of designating a bit position to be changed on the basis of predetermined bit information of the data part.

4. The method according to claim 1, wherein the data part of the encoded data is formed of flag bits of a plurality of image area attributes of a pixel of image data.

5. The method according to claim 1, wherein the data part of the encoded data is data obtained by encoding image data.

6. The method according to claim 1, wherein the encoded data is PackBits encoded data.

7. An encoding apparatus for re-encoding encoded data, which is represented by a data format of a runlength code part indicating a runlength of the same data and a data part indicating the data, and a runlength code part indicating a runlength of different data and a data part indicating the different data, to that data format, comprising:
    input means for inputting encoded data in the data format;
    separation means for separating a runlength code part and a data part from the input encoded data;
    change means for changing a desired bit in the separated data part;
    reconstruction means for reconstructing the data format on the basis of the changed data part and the runlength code part without decoding the input encoded data; and
    output means for outputting the reconstructed data as re-encoded data.

8. A computer program functioning as an encoding apparatus for re-encoding encoded data, which is represented by a data format of a runlength code part indicating a runlength of the same data and a data part indicating the data, and a runlength code part indicating a runlength of different data and a data part indicating the different data, to that data format, said program functioning as:
    input means for inputting encoded data in the data format;
    separation means for separating a runlength code part and a data part from the input encoded data;
    change means for changing a desired bit in the separated data part;
    reconstruction means for reconstructing the data format on the basis of the changed data part and the runlength code part without decoding the input encoded data; and
    output means for outputting the reconstructed data as re-encoded data.

9. A computer readable storage medium storing a computer program of claim 8.

10. An image forming apparatus comprising:
    an image compression encoding unit, adapted to compression encode image data for one page and to store encoded image data in a first storage unit;
    an image area determination unit, adapted to determine an image area of each pixel data of the image data, information indicating an image area determination result being 1 byte data, and determination results for respective image area types being assigned to respective bits;
    an image area compression encoding unit, adapted to compression-encode the image area information of each pixel obtained by said image area determination unit, and to store the encoded image area information in a second storage unit;
    a decoding unit, adapted to decode the encoded data stored in the first storage unit and the encoded data stored in the second storage unit; and
    a print unit, adapted to correct the decoded image data on the basis of the decoded image area information, and print the corrected image data,
    wherein said image area compression encoding unit comprises:
        a mask unit, adapted to mask a desired bit of the image area information of one pixel obtained from said image area determination unit;
        a PackBits encoder, adapted to PackBits encode the image area information masked by said mask unit, and store the PackBits encoded image area information in the second storage unit; and
        a monitor unit, adapted to monitor a code size in the second storage unit, and, when the PackBits code size stored in the second storage unit reaches a predetermined size during encoding of image area information for one page, re-encode PackBits encoded data stored in the second storage unit by masking a predetermined bit of a data part of the PackBits encoded data, re storing the re-encoded data in the second storage unit, and setting said mask unit to mask the predetermined bit of image area information to be input subsequently.

11. A method of controlling an image forming apparatus comprising:
    an image compression encoding step, of compression encoding image data for one page and storing encoded image data in a first storage unit;
    an image area determination step, of determining an image area of each pixel data of the image data, information indicating an image area determination result being 1 byte data, and determination results for respective image area types being assigned to respective bits;
    an image area compression encoding step, of compression encoding the image area information of each pixel obtained in said image area determination step, and storing the encoded image area information in a second storage unit;

a decoding step, of decoding the encoded data stored in the first storage unit and the encoded data stored in the second storage unit; and a print step, of correcting the decoded image data on the basis of the decoded image area information, and printing the corrected image data, in which said image area compression encoding step comprises:

a mask step, of masking a desired bit of the image area information of one pixel obtained in the image area determination step;

a PackBits encoding step, of PackBits-encoding the image area information masked in the mask step, and storing the PackBits encoded image area information in the second storage unit; and a monitor step, of monitoring a code size in the second storage unit, re-encoding, when the PackBits code size stored in the second storage unit reaches a predetermined size during encoding of image area information for one page, PackBits encoded data stored in the second storage unit by masking a predetermined bit of a data part of the PackBits encoded data, re-storing the re-encoded data in the second storage unit, and setting said mask step to mask the predetermined bit of image area information to be input subsequently.

12. An encoding method for re-encoding encoded data, which is represented by a data format of a runlength code part indicating a runlength of the same data and a data part indicating the data, to the data format, comprising:

a step of inputting encoded data in the data format;

a step of acquiring a runlength code part and a data part from the input encoded data;

a step of changing a desired part in the acquired data part; and a step of reconstructing the data format on the basis of the changed data part and the runlength code part without decoding the input encoded data.

13. The method according to claim 12, wherein, in said changing step, the different data parts of a plurality of encoded data are changed so as to hold the same data part.

14. The method according to claim 12, wherein, in said changing step, a desired bit in the acquired data part is changed.

15. The method according to claim 12, wherein the encoded data is data represented by encoding attributes of image data.

16. The method according to claim 12, wherein the encoded data is PackBits encoded data.

17. An encoding apparatus for re-encoding encoded data, which is represented by a data format of a runlength code part indicating a runlength of the same data and a data part indicating the data, to the data format, comprising:

input means for inputting encoded data in the data format;

acquisition means for acquiring a runlength code part and a data part from the input encoded data;

changing means for changing a desired part in the acquired data part; and reconstruction means for reconstructing the data format on the basis of the changed data part and the runlength code part without decoding the input encoded data.

18. A computer program functioning as an encoding apparatus for re-encoding encoded data, which is represented by a data format of a runlength code part indicating a runlength of the same data and a data part indicating the data, to the data format, said program functioning as:

input means for inputting encoded data in the data format;

acquisition means for acquiring a runlength code part and a data part from the input encoded data;

changing means for changing a desired part in the acquired data part; and reconstruction means for reconstructing the data format on the basis of the changed data part and the runlength code part without decoding the input encoded data.

* * * * *

UNITED STATES PATENT AND TRADEMARK OFFICE
CERTIFICATE OF CORRECTION

PATENT NO. : 6,958,714 B2
APPLICATION NO. : 10/793848
DATED : October 25, 2005
INVENTOR(S) : Yoshinobu Umeda It is certified that error appears in the above-identified patent and that said Letters Patent is hereby corrected as shown below:

COLUMN 1

Line 13, "one of" should read --one of the--; and
Line 40, "data" should read --data"--.

COLUMN 3

Line 14, "case" should read --the case--;
Line 27, "2, . . ." should read --2, . . . )--; and
Line 28, ") are" should read --are--.

COLUMN 5

Line 12, "process" should read --processes--.

COLUMN 6

Table, Line 23, "color 0" should read --color = 0--.

COLUMN 7

Line 66, "encoded" should read --encoded data--.

COLUMN 10

Line 59, "an value" should read --a value--.

COLUMN 12

Line 19, "case" should read --the case--.

COLUMN 14

Line 45, "that the" should read --that "the--.

COLUMN 15

Line 33, "form" should read --from--.

UNITED STATES PATENT AND TRADEMARK OFFICE
CERTIFICATE OF CORRECTION

PATENT NO. : 6,958,714 B2
APPLICATION NO. : 10/793848
DATED : October 25, 2005
INVENTOR(S) : Yoshinobu Umeda It is certified that error appears in the above-identified patent and that said Letters Patent is hereby corrected as shown below:

COLUMN 16

Line 7, "that the" should read --that "the--.

COLUMN 22

Line 51, "timing to" should read --timing t0--.

COLUMN 23

Line 35, "t20in" should read --t20 in--
Line 38, "t20in" should read --t20 in--;
Line 50, "t21in" should read --t21 in--; and
Line 56, "codes." should read --codes).--;

COLUMN 25

Line 21, "encoded" should read --input encoded--.

COLUMN 26

Line 50, "re storing" should read --re-storing--.

COLUMN 27

Line 15, "PackBits-encoding" should read --PackBits encoding--.

UNITED STATES PATENT AND TRADEMARK OFFICE
CERTIFICATE OF CORRECTION

PATENT NO. : 6,958,714 B2
APPLICATION NO. : 10/793848
DATED : October 25, 2005
INVENTOR(S) : Yoshinobu Umeda It is certified that error appears in the above-identified patent and that said Letters Patent is hereby corrected as shown below:

COLUMN 28

Line 22, "and reconstruction" should read --and ¶ reconstruction--.

Signed and Sealed this

Twenty-second Day of August, 2006

JON W. DUDAS
*Director of the United States Patent and Trademark Office*